(12) United States Patent
Choi et al.

(10) Patent No.: US 8,962,455 B2
(45) Date of Patent: Feb. 24, 2015

(54) METHOD OF FABRICATING SEMICONDUCTOR DEVICE

(71) Applicant: SAMSUNG Electronics Co., Ltd., Suwon-si, Gyeonggi-do (KR)

(72) Inventors: Sang-Hyun Choi, Hwaseong-si (KR); Jin-Ho Noh, Hwaseong-si (KR); Yoon-Ho Son, Yongin-si (KR); Dae-Hyuk Chung, Seongnam-si (KR); In-Seak Hwang, Suwon-si (KR); Tae-Joon Park, Hwaseong-si (KR); Tae-Ho Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/920,181

(22) Filed: Jun. 18, 2013

(65) Prior Publication Data

US 2013/0341710 A1 Dec. 26, 2013

(30) Foreign Application Priority Data

Jun. 20, 2012 (KR) ........................ 10-2012-0066231

(51) Int. Cl.
| | | |
|---|---|---|
| *H01L 21/36* | (2006.01) | |
| *H01L 21/768* | (2006.01) | |
| *H01L 21/28* | (2006.01) | |
| *H01L 29/78* | (2006.01) | |
| *H01L 29/423* | (2006.01) | |
| *H01L 27/108* | (2006.01) | |

(52) U.S. Cl.
CPC .... *H01L 21/76841* (2013.01); *H01L 21/28158* (2013.01); *H01L 29/7827* (2013.01); *H01L 29/4236* (2013.01); *H01L 27/10876* (2013.01); *H01L 27/10891* (2013.01)
USPC ........... 438/478; 438/242; 438/259; 438/270; 438/272; 438/589; 257/330; 257/331; 257/E27.091; 257/E29.291; 257/E21.585

(58) Field of Classification Search
None
See application file for complete search history.

(56) References Cited

U.S. PATENT DOCUMENTS

| 2011/0003468 A1 | 1/2011 | Song |
| 2011/0156135 A1* | 6/2011 | Yoon et al. ................... 257/330 |

FOREIGN PATENT DOCUMENTS

| KR | 1020090038590 | 4/2009 |
| KR | 1020100079795 | 7/2010 |
| KR | 1020110024633 | 3/2011 |

* cited by examiner

*Primary Examiner* — Yasser A Abdelaziez
(74) *Attorney, Agent, or Firm* — Ellsworth IP Group, PLLC

(57) ABSTRACT

A method of fabricating a semiconductor device includes forming a first preliminary gate barrier layer and a first preliminary gate electrode recessed to have a first depth from the surface of the substrate within a gate trench, removing an upper portion of the first preliminary gate electrode by means of a first wet etching process using a first etchant to form a second preliminary gate electrode recessed to have a second depth greater than the first depth, and removing an upper portion of the first preliminary gate barrier layer and an upper portion of the second preliminary gate electrode by means of a second wet etching process using a second etchant to form a gate electrode and a gate barrier layer recessed to a third depth greater than the second depth.

15 Claims, 22 Drawing Sheets

METHOD OF FABRICATING SEMICONDUCTOR DEVICE

CROSS-REFERENCE TO RELATED APPLICATIONS

This application claims priority under 35 U.S.C. §119 to Korean Patent Application No. 10-2012-0066231 filed on Jun. 20, 2012, the disclosure of which is hereby incorporated by reference in its entirety.

BACKGROUND

1. Field

Embodiments of the inventive concept relate to a semiconductor device including a buried gate line and a method of fabricating the same.

2. Description of the Related Art

With the increase in integration density of semiconductor devices, various methods may be usable to form a gate barrier layer of a buried gate line and a gate electrode.

SUMMARY

Embodiments of the inventive concept provide a method of fabricating a semiconductor device, which may prevent a material forming a gate barrier layer from remaining on a side surface of a gate insulating layer, which is not in contact with the gate barrier layer, during a process of forming a gate electrode and the gate barrier layer on the gate insulating layer formed on bottom and side surfaces of a gate trench to fill a lower portion of the gate trench.

Other embodiments of the inventive concept provide a method of fabricating a semiconductor device, which may prevent loss of a gate insulating layer during a process of recessing a gate barrier layer and a gate electrode.

Other embodiments of the inventive concept provide a method of fabricating a semiconductor device, which may prevent a material forming a gate barrier layer from remaining on a side surface of a gate trench on which a gate insulating layer is not formed, and prevent occurrence of defects on the side surface of the gate trench during a process of recessing the gate barrier layer and a gate electrode.

Other embodiments of the inventive concept provide a method of fabricating a semiconductor device including a gate electrode with minimized surface dispersion.

Other embodiments of the inventive concept provide a method of fabricating a semiconductor device by which the distance between a gate barrier layer and an impurity layer of an active region is increased and a channel length is reduced.

Other embodiments of the inventive concept provide a method of fabricating a semiconductor device, which includes performing a dry etching process, a first wet etching process, and a second wet etching process to recess a gate barrier layer and a gate electrode.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a method of fabricating a semiconductor device, the method including forming a gate trench in a substrate, forming a gate insulating layer on bottom and side surfaces of the gate trench, forming a gate barrier material layer and a gate electrode material layer on bottom and side surfaces of the gate insulating layer and a top surface of the substrate, removing the gate barrier material layer and the gate electrode material layer from the substrate to form a first preliminary gate barrier layer and a first preliminary gate electrode recessed to a first depth from the surface of the substrate within the gate trench, removing an upper portion of the first preliminary gate electrode by means of a first wet etching process using a first etchant to form a second preliminary gate electrode recessed to a second depth greater than the first depth, removing an upper portion of the first preliminary gate barrier layer and an upper portion of the second preliminary gate electrode by means of a second wet etching process using a second etchant to form a gate electrode and a gate barrier layer recessed to a third depth greater than the second depth, and forming a gate capping layer to cover the gate barrier layer and the gate electrode and fill the gate trench.

The gate barrier material layer may include titanium nitride (TiN), and the gate electrode material layer may include tungsten (W).

The first etchant may contain about 69.995 to 69.999% by weight water, about 30% by weight hydrogen peroxide ($H_2O_2$), and about 0.001 to 0.005% by weight ammonium ($NH_4$)-based tungsten etching inhibitor.

The second etchant may contain sulfuric acid ($H_2SO_4$) and the first etchant, and the second etchant may contain about 7.5 to 15% by weight sulfuric acid ($H_2SO_4$) and about 85 to 92.5% by weight first etchant.

The foregoing and/or other features and utilities of the present general inventive concept may be achieved by providing a method of fabricating a semiconductor device, the method including forming a substrate having an active region and a field region, forming a gate trench to be disposed in the active region and the field region of the substrate, forming a gate insulating layer on a first surface of a first portion of the gate trench disposed in the active region, forming a gate barrier layer on a lower portion of the gate insulating layer in the first portion of the gate trench disposed in the active region and on a lower portion of a second surface of a second portion of the gate trench disposed in the field region, forming a gate electrode on the gate barrier layer in the first portion and the second portion of the gate trench, the gate electrode having a variable depth between an active region depth and a field region depth, and forming a gate capping layer on top surfaces of the gate electrode and the gate barrier layer in the gate trench.

The method may further include forming a second gate trench to be disposed within the active region, forming a gate insulating layer on the second gate trench, forming a gate barrier layer on a lower portion of the gate insulating layer, forming a gate electrode on the gate barrier layer in the second gate trench, and forming a gate capping layer on the gate electrode and the gate barrier layer in the gate trench.

A bottom surface of the gate capping layer and top surfaces of the gate electrode and the gate barrier layer form at least one of a straight surface, a curved surface, and stepped surface.

A semiconductor device may be formed according to the method described above or hereinafter.

An electronic apparatus may include a functional unit and the semiconductor device describes above or hereinafter to store data therein such that the functional unit performs an operation according to the data.

BRIEF DESCRIPTION OF THE DRAWINGS

The foregoing and other features and utilities of the present general inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 2A through 4A and 2B through 4B are schematic longitudinal sectional views taken along lines I-I and II-II of FIG. 1, respectively;

FIGS. 6A through 18A and 6B through 18B are schematic longitudinal sectional views taken along lines I-I and II-II of FIG. 1, respectively, illustrating sequential process operations of a method of fabricating the semiconductor device according to an embodiment of the inventive concept;

DETAILED DESCRIPTION OF THE PREFERRED EMBODIMENTS

Figure 1:
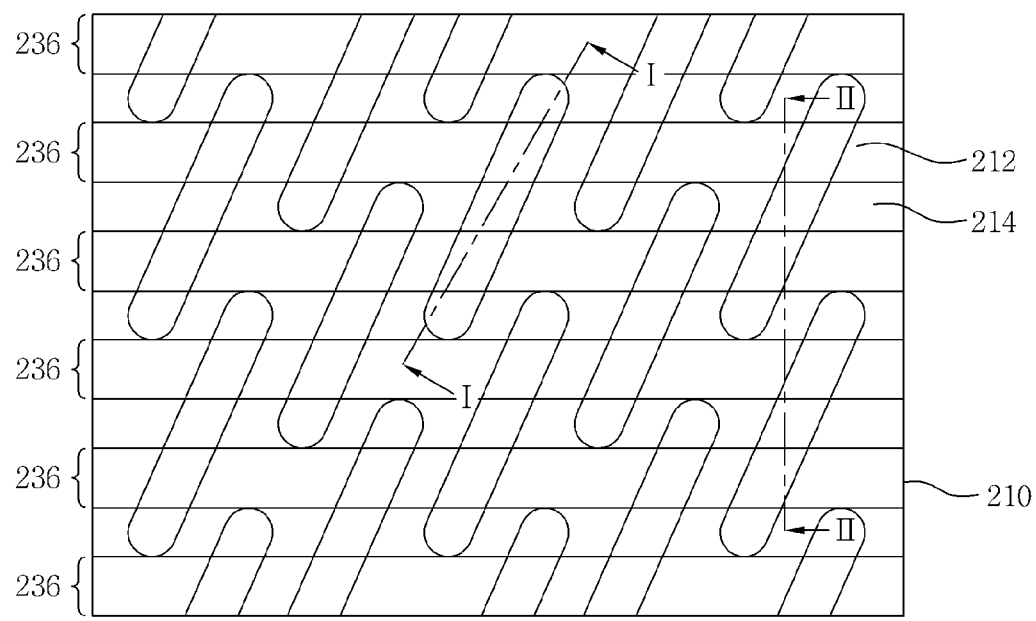
FIG. 1 is a plan view illustrating a semiconductor device according to an embodiment of the inventive concept.

The inventive concept will now be described more fully hereinafter with reference to the accompanying drawings, in which exemplary embodiments of the inventive concept are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

Embodiments of the inventive concept are described herein with reference to plan and cross-section illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concept.

FIG. 1 illustrates a semiconductor device according to an embodiment of the inventive concept.

Referring to FIG. 1, each of semiconductor devices 200a, 200b, and 200c according to embodiments of the inventive concept may include a substrate 210, one or more active regions 212 and a field region 214 defined in the substrate 210, and word lines (or gate lines) 236 extending in the active region 212 and the field region 214 in one direction.

The active regions 212 may be arranged as a plurality of island types in a surface of the substrate 210. The island-type active regions 212 may have bar shapes elongated at an angle to the one direction of the word lines 236.

The word lines 236 may be buried in the substrate 210 and extend parallel to one another in one direction. Structures and formation methods of the word lines 236 will be described in detail later.

FIGS. 2A and 2B, 3A and 3B, and 4A and 4B are schematic longitudinal sectional views taken along lines I-I and II-II of FIG. 1, illustrating the semiconductor devices 200a, 200b, and 200c, respectively. Hereinafter, the above-described word lines 236 will be called gate lines 236, and like elements will be denoted by like numbers.

Figure 2A:
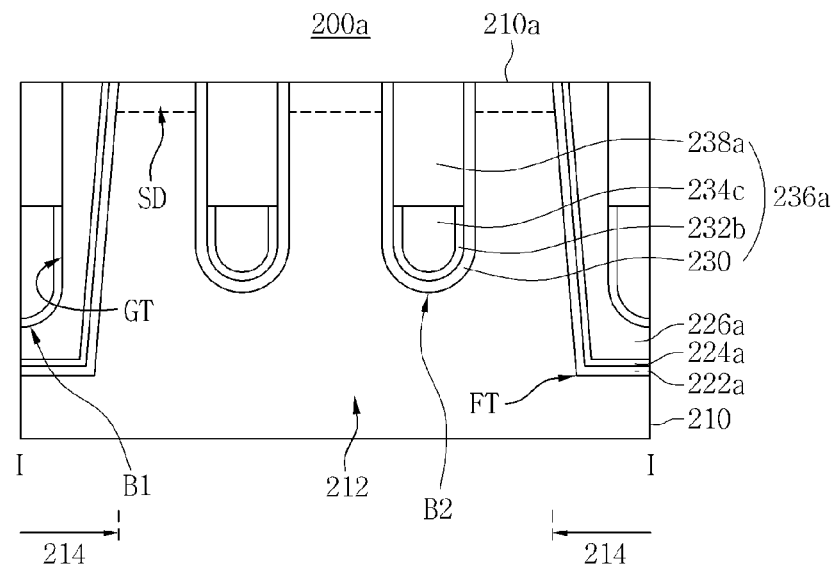
Figure 2B:
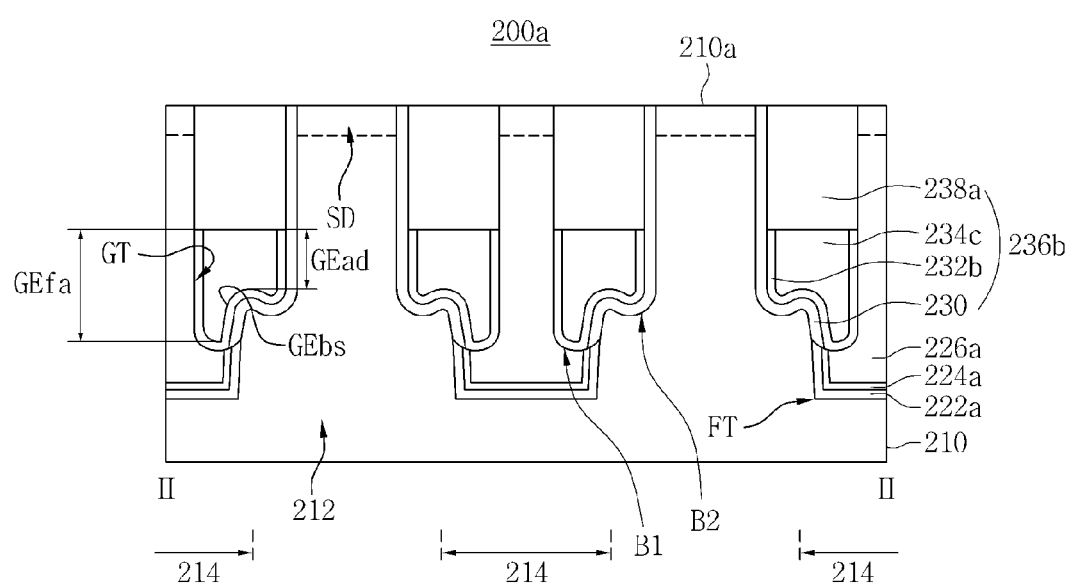

Referring to FIGS. 2A and 2B, the semiconductor device 200a according to an embodiment of the inventive concept may include a substrate 210 and gate lines 236 buried in the substrate 210.

The substrate 210 may include a silicon (Si) wafer. The substrate 210 may include active regions 212 and a field region 214.

The field region 214 may include a field trench FT, field trench liners 222a and 224a formed on bottom and side surfaces of the field trench FT, and a field trench insulating layer 226a filling the field trench FT.

The field trench liners 222a and 224a may include a first field trench liner 222a, and a second field trench liner 224a sequentially stacked on the bottom and side surfaces of the field trench FT. For example, the first field trench liner 222a may include silicon oxide ($SiO_2$), and the second field trench liner 224a may include silicon nitride ($SiN_x$). Here, x is an integer. The field trench insulating layer 226a may include silicon oxide.

Each of the gate lines 236 may include a gate insulating layer 230, a gate barrier layer 232b, a gate electrode 234c, and a gate capping layer 238a formed within a gate trench GT. The gate trench GT may extend in a horizontal direction to cross both the active region 212 and the field region 214, and the gate trench GT may be recessed to different depths in the field region 214 and the active region 212. For example, the gate trench GT may be recessed to a greater depth in the field region 214 than in the active region 212 based on a planarized top surface 210a of the substrate 210 so that the gate trench GT can have a lower bottom surface B1 in the field region 214 than a bottom surface B2 in the active region 212. The substrate 210 may have recesses having various dimensions or shapes to accommodate the field trench FT and the gate trench GT according to the active regions 212 and the field region 214.

The gate insulating layer 230 may be conformally formed on a bottom surface B2 and side surface of the gate trench GT disposed in the active region 212. The gate insulating layer 230 may be formed by oxidizing the surface of the gate trench GT. The gate barrier layer 232b may be conformally formed on bottom and side surfaces of the gate insulating layer 230, and the bottom surface B1 and a side surface of the gate trench GT. For example, the gate barrier layer 232b may be in contact with the gate insulating layer 230 in the active region 212, and in contact with the gate trench GT in the field region 214. The gate barrier layer 232b may include titanium (Ti), titanium nitride (TiN), tantalum (Ta), tantalum nitride (TaN), titanium tungsten (TiW), or other barrier metals. The gate electrode 234c may be formed on the gate barrier layer 232b to fill the gate trench GT. The gate electrode 234c may include, for example, a metal, such as tungsten (W). For example, top surfaces of the gate barrier layer 232b and the gate electrode 234c may be recessed to be lower than ½ the depth of the gate trench GT.

The gate electrode 234c may have a bottom surface GEbs variable according to a distance from the top surface 210a of the substrate 210. The gate electrode 234c may have a field depth GEfd in the field region 214 and an active depth GEad in the active region 212. The field depth GEfd is greater than the active depth GEfd.

A depth of the gate electrode 234c is non-linearly variable (non-linearly curved according to a distance from the top surface 210a and a distance from the adjacent gate electrode 234c) when the gate electrode 234c is disposed in the active region 212 and the field region 214. The gate electrode 234c is linearly variable (or linearly curved with respect to the top surface 210a) when the gate electrode 234 is disposed in the active region 212.

The remaining portion of the gate trench GT except the gate electrode 234c and the gate barrier layer 232b may be filled with the gate capping layer 238a. The gate capping layer 238a may include, for example, an insulating material, such as silicon nitride. The active regions 212 between the gate lines 236 may include impurity layers SD. The impurity layers SD may be referred to as source and drain regions.

When the gate barrier layer 232b and the gate electrode 234c are recessed to have top surfaces with the same depth with respect to the top surface 210a of the substrate 210, the likelihood of delamination between the gate barrier layer 232b or the gate electrode 234c and the gate capping layer 238a may be minimized, thereby ensuring device reliability.

Figure 3A:
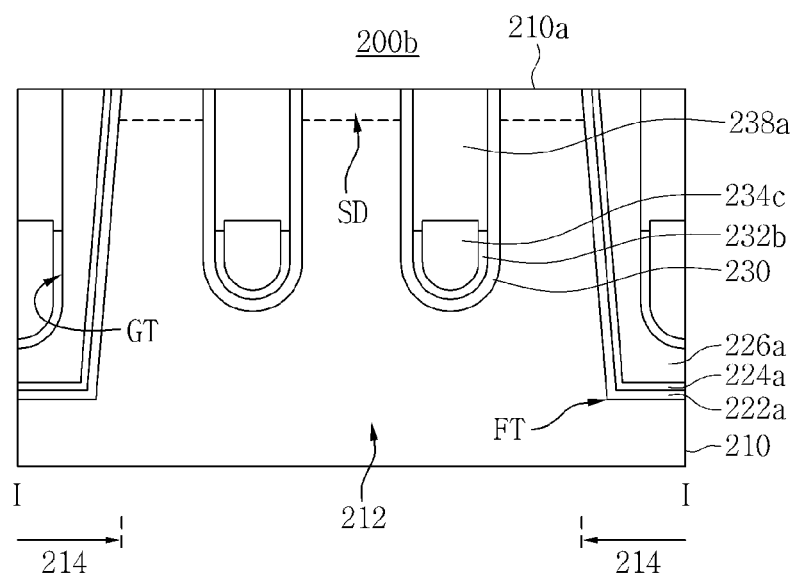
Figure 3B:
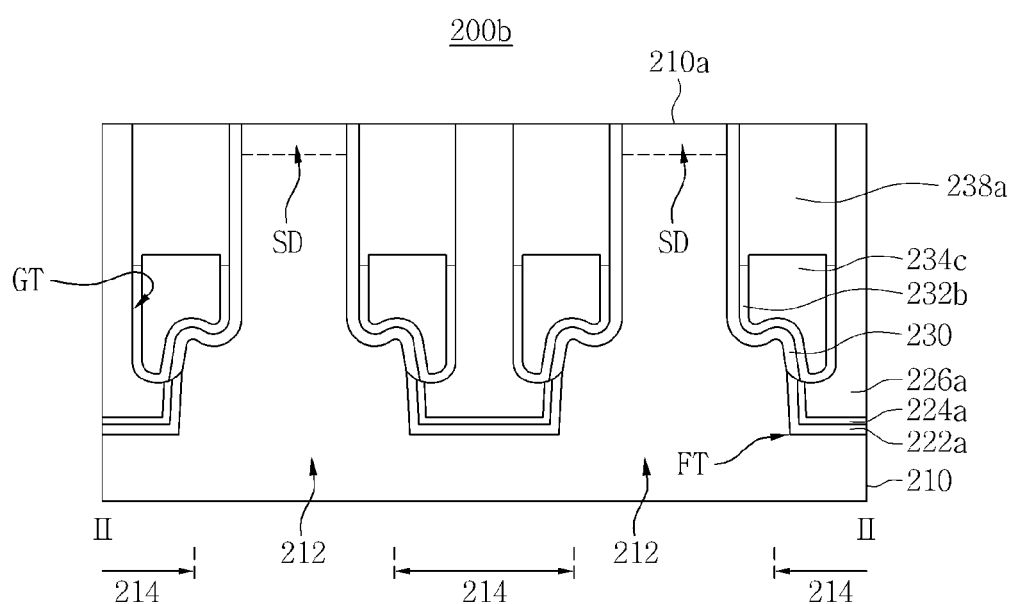

Referring to FIGS. 3A and 3B, the semiconductor device 200b according to an embodiment of the inventive concept may include a substrate 210 and gate lines 236 buried in the substrate 210. The substrate 210 may include active regions 212 and field region 214. Each of the gate lines 236 may include a gate insulating layer 230, a gate barrier layer 232b, a gate electrode 234c, and a gate capping layer 238a formed within a gate trench GT. The gate trench GT may be recessed to have different depths in the field region 214 and the active region 212 with respect to the top surface 210a of the substrate 210. For example, the gate trench GT may be recessed from the planarized top surface 210a of the substrate 210 by a greater depth in the field region 214 than in the active region 212. Thus, the gate trench GT may have a lower bottom surface in the field region 214 than in the active region 212. The gate insulating layer 230 may be conformally formed on bottom and side surfaces of the gate trench GT disposed in the active region 212.

In the semiconductor device 200b according to the embodiment of the inventive concept, the gate electrode 234c and the gate barrier layer 232b may be recessed to have top surfaces lower than a half of the depth of the gate trench GT with respect to the top surface 210a of the substrate 210, and the top surface of the gate barrier layer 232b may be recessed to be lower than the top surface of the gate electrode 234c. When the gate barrier layer 232b has a lower top surface and the gate electrode 234c has a higher top surface, a distance between the gate barrier layer 232b and the impurity layer SD may be increased and a channel length may be reduced so that a leakage current can be minimized.

Figure 4A:
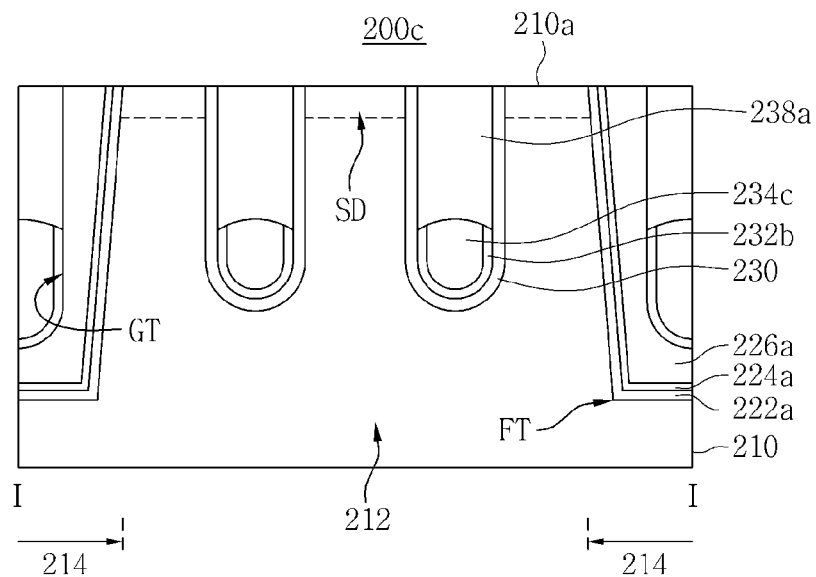
Figure 4B:
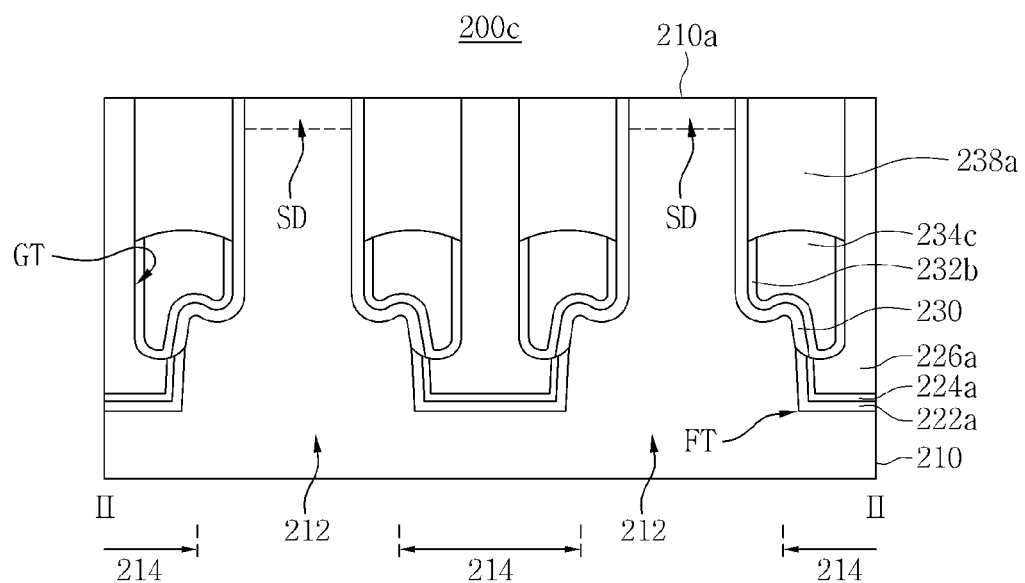

Referring to FIGS. 4A and 4B, the semiconductor device 200c according to an embodiment of the inventive concept may include a substrate 210 and gate lines 236 buried in the substrate 210. The substrate 210 may include active regions 212 and field region 214. Each of the gate lines 236 may include a gate insulating layer 230, a gate barrier layer 232b, a gate electrode 234c, and a gate capping layer 238a formed within a gate trench GT. In the semiconductor device 200c, the gate trench GT may be recessed to different depths in the field region 214 and the active region 212. For example, the gate trench GT may be recessed to a greater depth in the field region 214 than in the active region 212 based on a planarized surface of the substrate 210. Thus, the gate trench GT may have a lower bottom surface in the field region 214 than in the active region 212. The gate insulating layer 230 may be conformally formed on bottom and side surfaces of the gate trench GT disposed in the active region 212.

In the semiconductor device 200c according to the embodiment of the inventive concept, top surfaces of the gate electrode 234c and the gate barrier layer 232b may be recessed to be lower than a half of the depth of the gate trench GT. Also, the top surface of the gate barrier layer 232b may be recessed to be lower than the top surface of the gate electrode 234c and may form a curve with the top surface of the gate barrier layer 232b. For example, the top surface of the gate electrode 234c and the top surface of the gate barrier layer 232b may form a downward curve from the center of the gate electrode 234c toward one side of the gate barrier layer 232b, which is in contact with a side surface of the gate insulating layer 230 or the gate trench GT. The top surfaces of the gate electrode 234c and the gate barrier layer 232b may be in a convex form and a lower surface of the gate capping layer 238a may be in a concave form. The top surfaces of the gate electrode 234c and the gate battier layer 232b may have a depth variable from the top surface 210a of the substrate 210 according to a distance from a center portion of the gate trench GT.

Similarly, a longer distance between the gate barrier layer 232b and an impurity layer SD may be ensured and a channel length may be reduced, thereby minimizing a leakage current.

Figure 5:
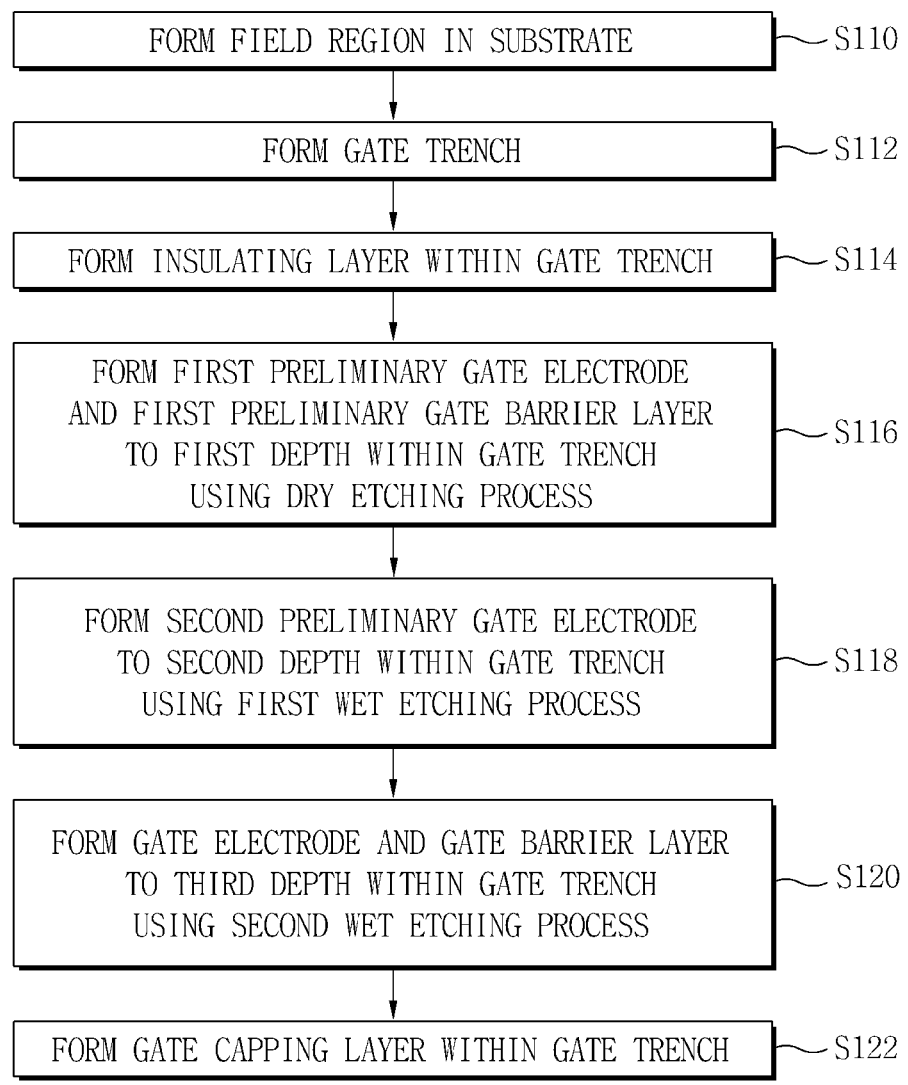
FIG. 5 is a schematic flowchart illustrating a method of fabricating a semiconductor device according to an embodiment of the inventive concept.

FIG. 5 is a schematic flowchart illustrating a method of fabricating a semiconductor device according to an embodiment of the inventive concept.

FIGS. 6A through 18A and 6B through 18B are schematic longitudinal sectional views taken along lines I-I and II-II of FIG. 1, respectively, illustrating sequential process operations of a method of fabricating a semiconductor device according to an embodiment of the inventive concept. Hereinafter, a method of fabricating the semiconductor device shown in the longitudinal sectional views of FIGS. 2A and 2B will be described. Also, since processes are performed in the same order, longitudinal sectional views taken along lines I-I and II-II of FIG. 1 will be described at the same time. Hereinafter, methods of fabricating a semiconductor device according to embodiments of the inventive concept will be described with reference to FIGS. 5, 6A through 18A, and 6B through 18B.

Figure 6A:
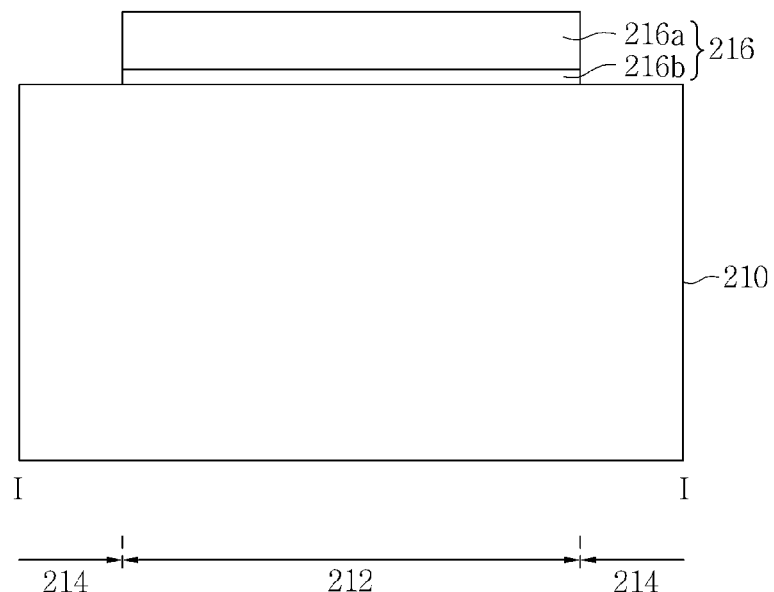
Figure 6B:
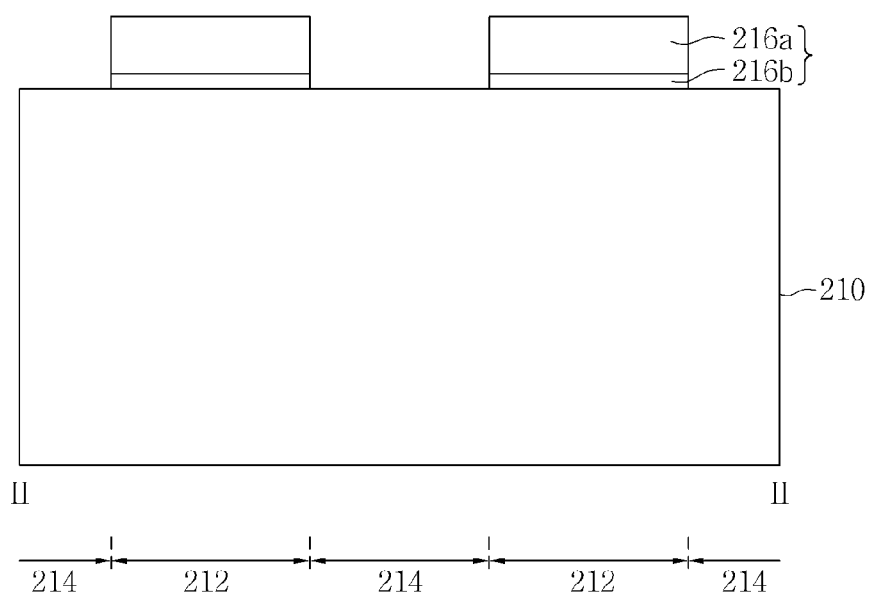

Referring to FIGS. 6A and 6B, the method of fabricating the semiconductor device according to an embodiment of the inventive concept may include forming a field trench mask 216 to expose a field region 214 of a substrate 210. The field trench mask 216 may include a second field trench mask 216b and a first field trench mask 216a stacked on the second field trench mask 216b. The first field trench mask 216a may include silicon oxide ($SiO_2$) and/or silicon nitride ($SiN_x$), and the second field trench mask 216b may include silicon oxide or silicon nitride.

Figure 7A:
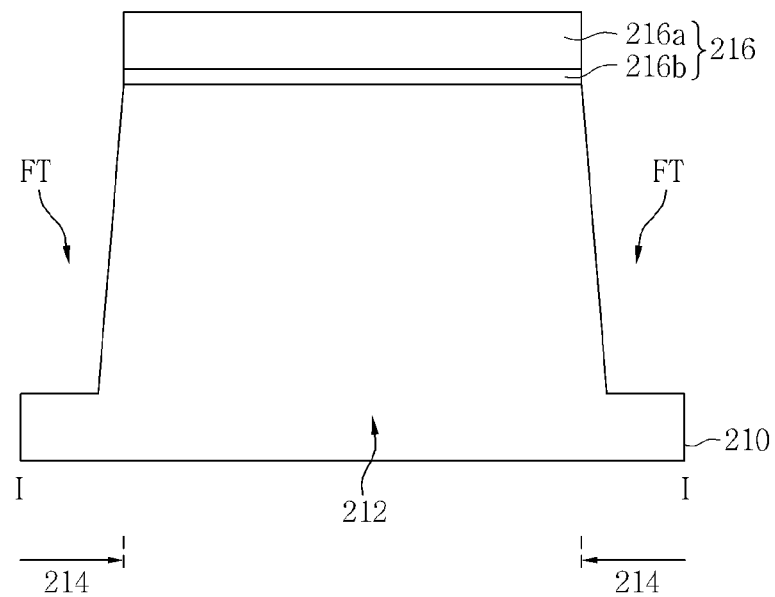
Figure 7B:
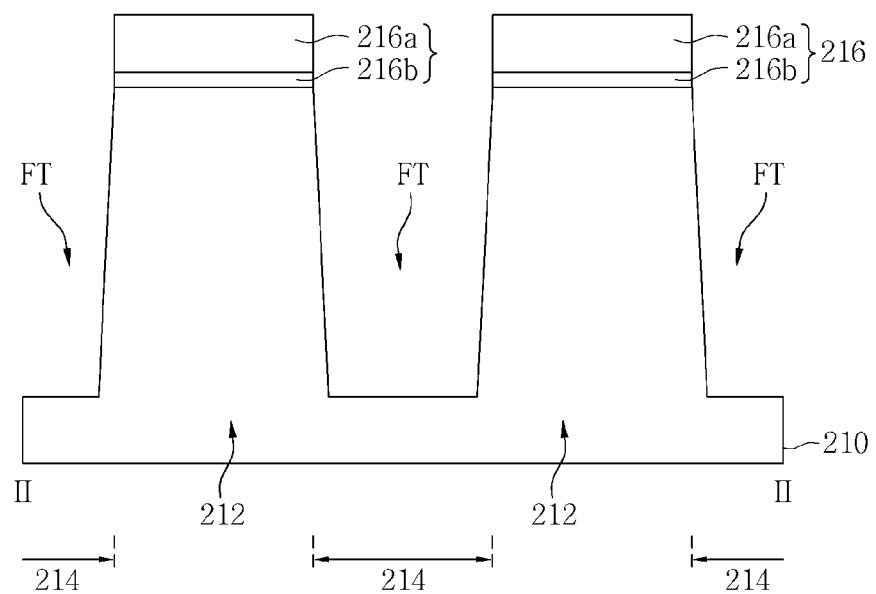

Referring to FIGS. 7A and 7B, the method of fabricating the semiconductor device according to the embodiment of the inventive concept may include forming a field trench FT in the field region 214 using the field trench mask 216 as an etch stop layer. The formation of the field trench FT may include selectively etching the substrate 210.

Figure 8A:
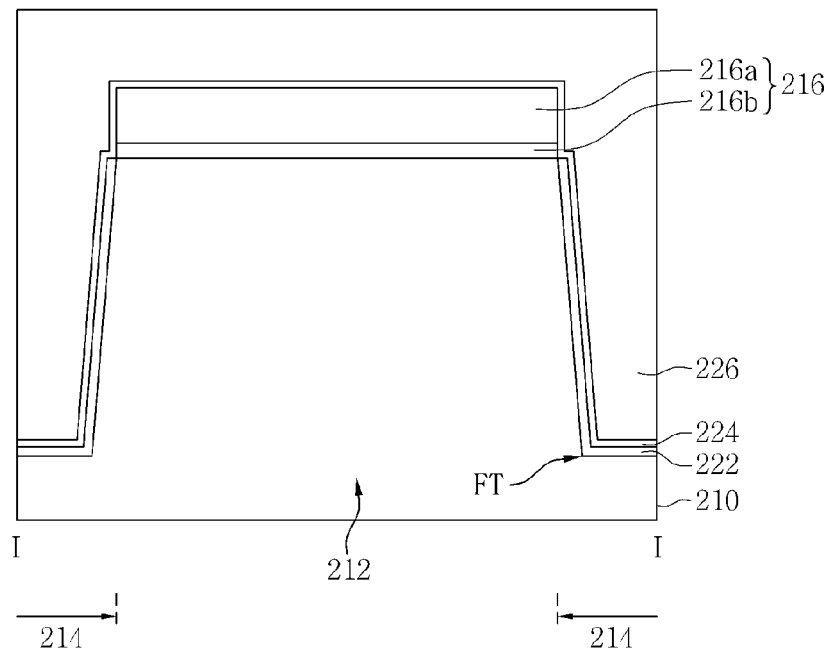
Figure 8B:
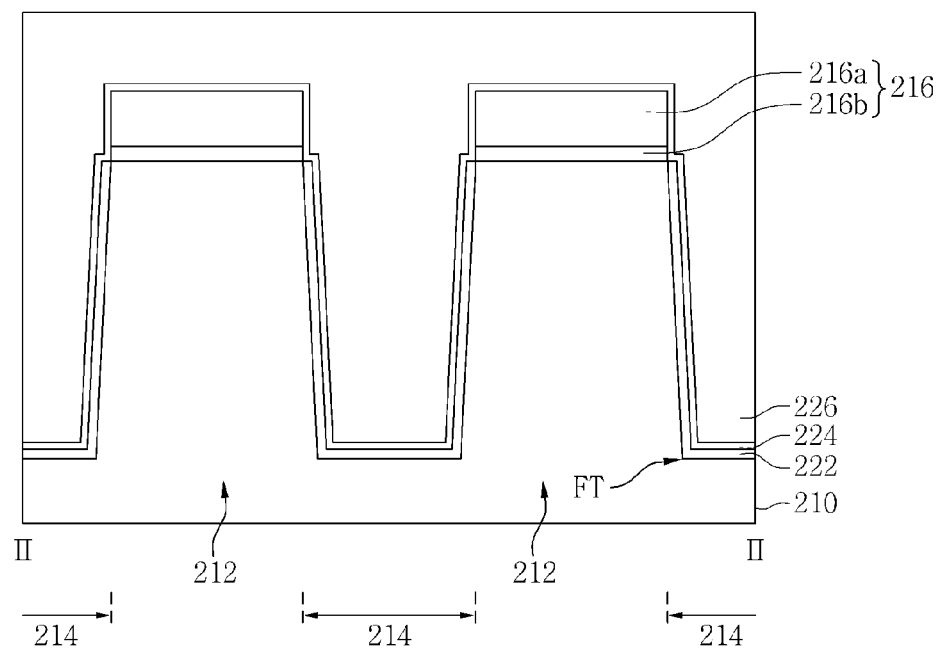

Referring to FIGS. 8A and 8B, the method of fabricating the semiconductor device according to the embodiment of the inventive concept may include forming a first field trench liner material layer 222, a second field trench liner material layer 224, and a field trench insulating material layer 226 on the substrate 210 including the field trench FT. The first field trench liner material layer 222 may include silicon oxide, and the second field trench liner material layer 224 may include silicon nitride. The formation of the first field trench liner material layer 222 may include oxidizing an inner wall of the field trench FT using a thermal oxidation process, while the formation of the second field trench liner material layer 224 may include a chemical vapor deposition (CVD) process. The formation of the field trench insulating material layer 226 may include depositing silicon oxide, such as Tonen silazane (TOSZ), undoped silicate glass (USG), or carbon-doped silicon oxide (SiOCH), using a CVD process. The field trench insulating material layer 226 may include silicon oxide.

Figure 9A:
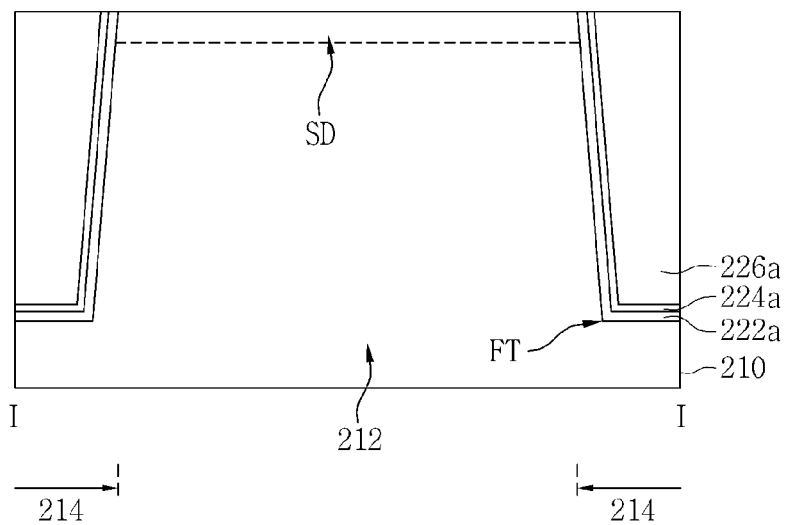
Figure 9B:
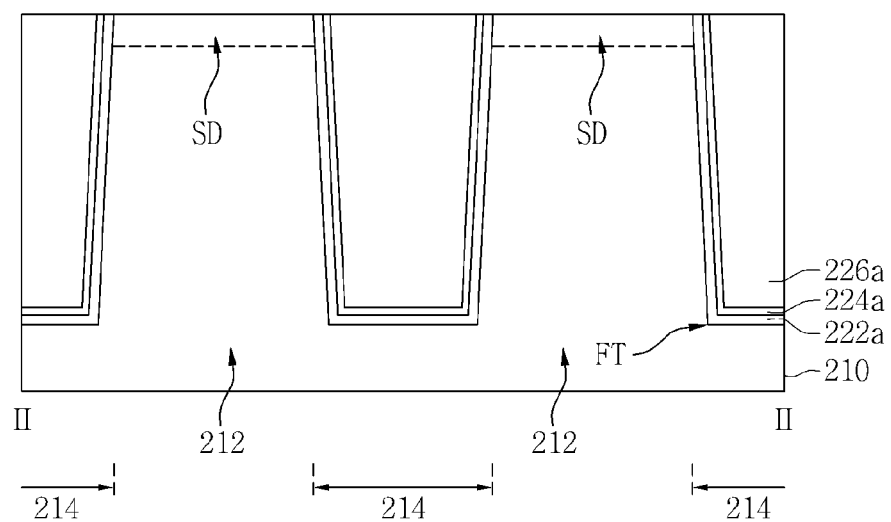

Referring to FIGS. 5, 9A and 9B, the method of fabricating the semiconductor device according to the embodiment of the inventive concept may include forming a field region 214 at operation S110. The field region 214 may be formed by planarizing a first field trench liner 222a, a second field trench liner 224b, and a field trench insulating layer 226a. For example, the planarization process may include a chemical mechanical polishing (CMP) process and/or an etch-back process. After the planarization process is performed, active regions 212 of the substrate 210 may be exposed. P-type impurities or n-type impurities may be doped into the active regions 212 to form impurity layers SD, which may be referred to as source or drain regions.

Figure 10A:
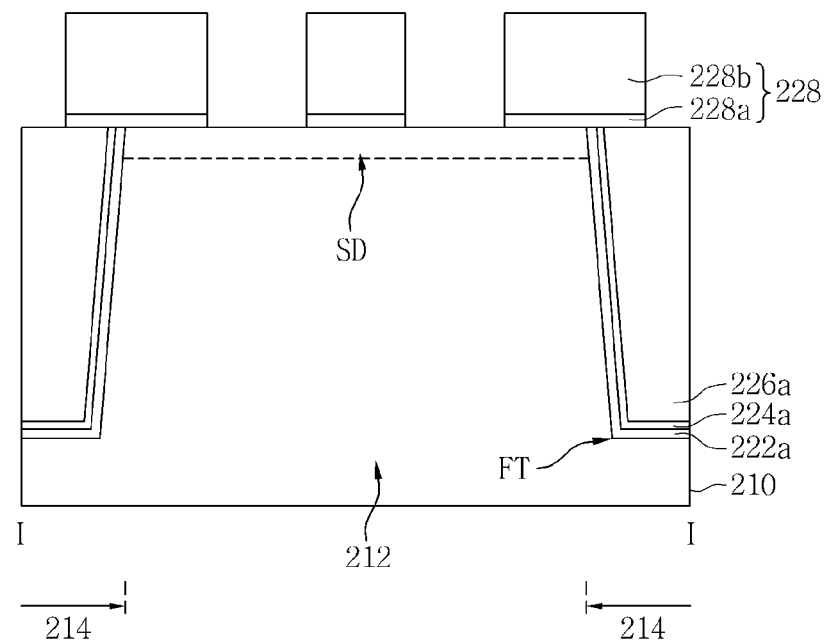
Figure 10B:
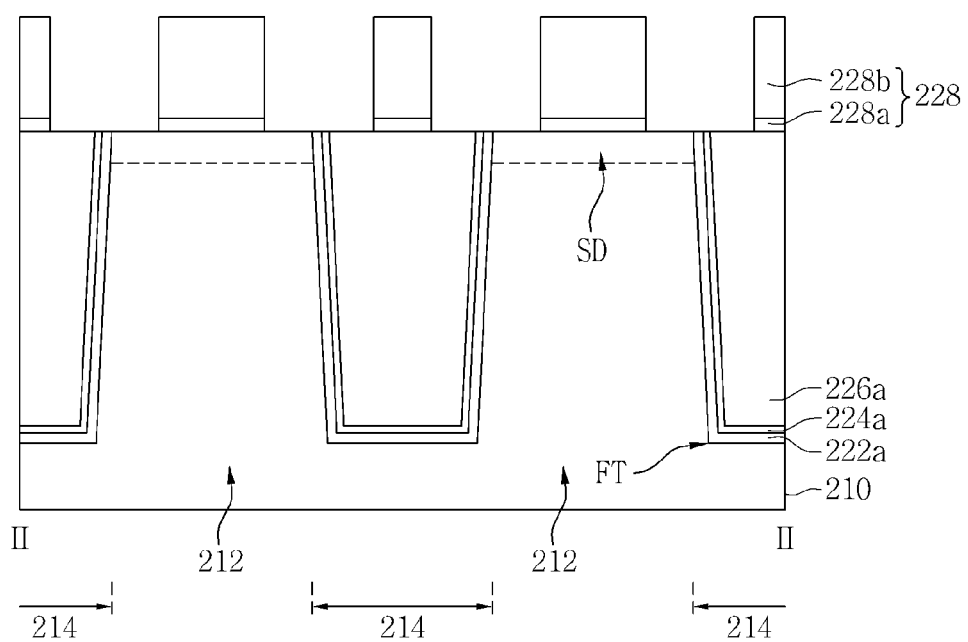

Referring to FIGS. 10A and 10B, the method of fabricating the semiconductor device according to the embodiment of the inventive concept may include forming a gate trench mask 228. The gate trench mask 228 may include a first gate trench mask 228a and a second gate trench mask 228b, which are stacked sequentially. The first gate trench mask 228a may include silicon oxide and/or silicon nitride, while the second gate trench mask 228b may include silicon oxide or silicon nitride.

The formation of the gate trench mask 228 may include a photolithography process and an etching process.

Figure 11A:
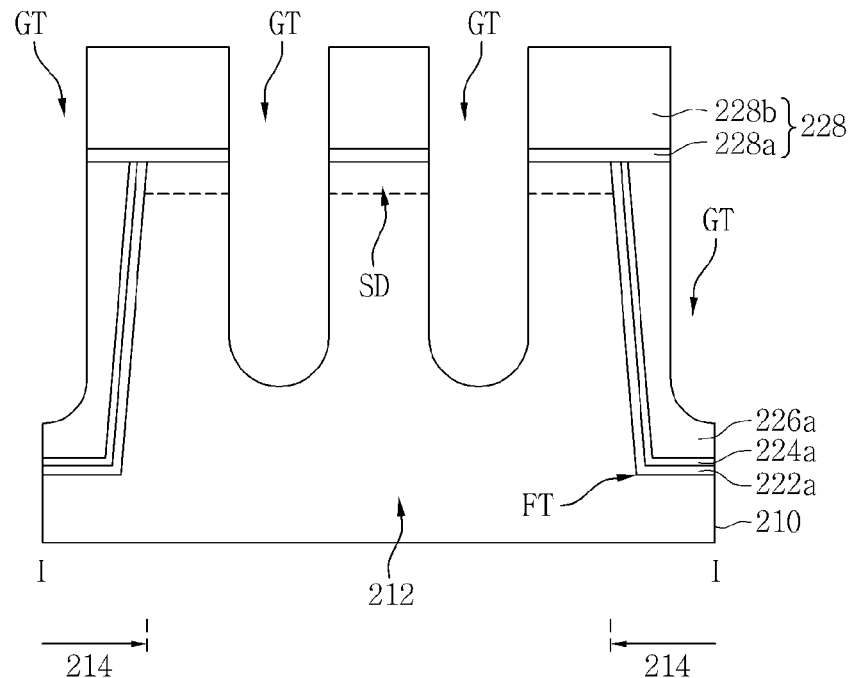
Figure 11B:
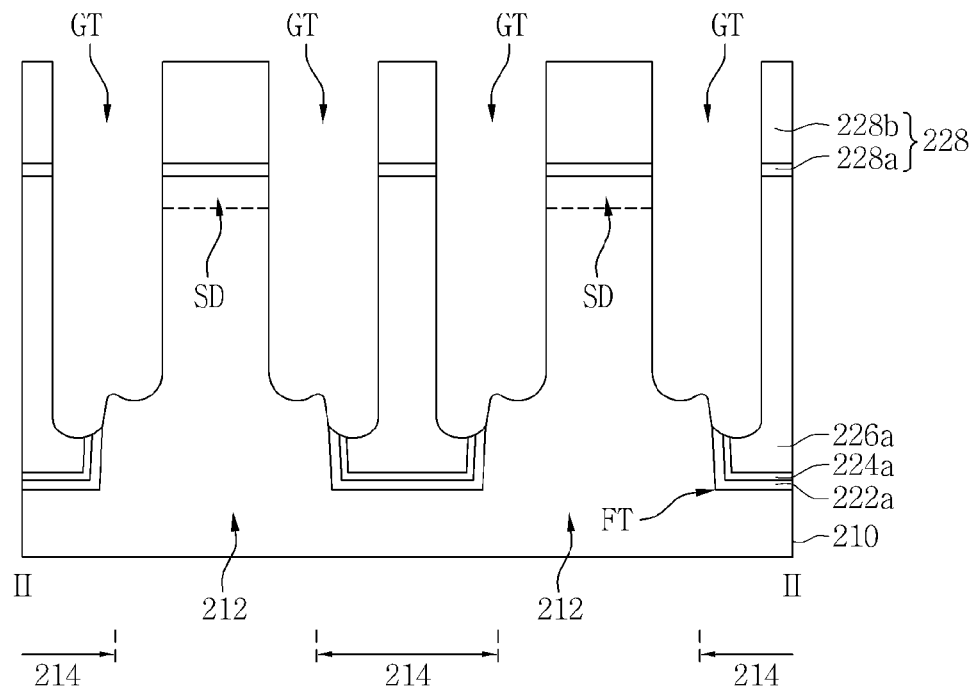

Referring to FIGS. 5, 11A, and 11B, the method of fabricating the semiconductor device according to the embodiment of the inventive concept may include forming gate trenches GT in the substrate 210 at operation S112. The gate trenches GT may be formed by forming recesses corresponding to the exposed portions of the substrate 210 using the gate trench mask 228 as an etch stop layer. In this case, the gate trenches GT formed in the field region 214 may be recessed from a planarized top surface of the substrate 210 to have a greater depth than the gate trenches GT formed in the active region 212. For example, the gate trenches GT may be formed to have lower bottom surfaces in the field region 214 than in the active region 212.

Figure 12A:
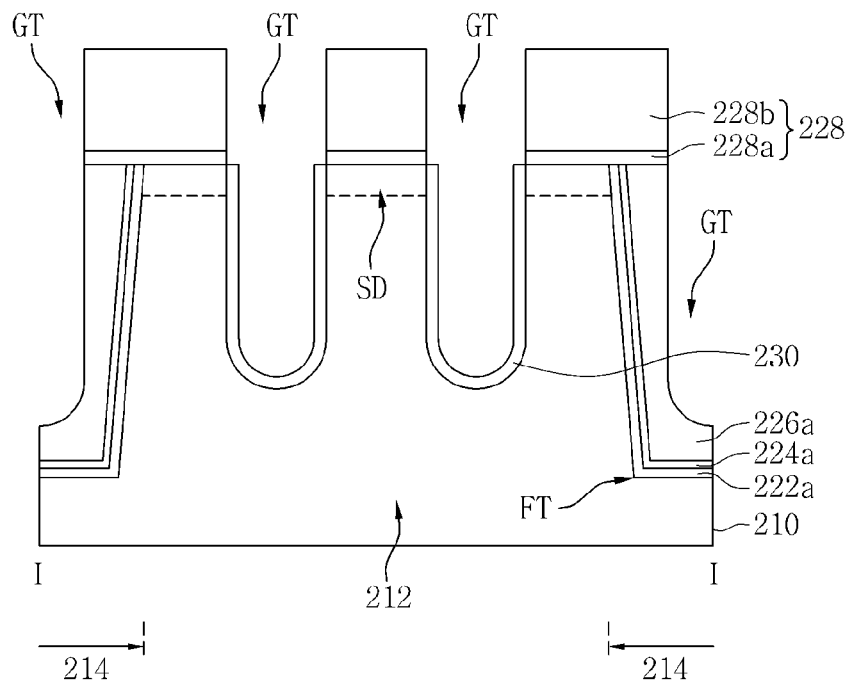
Figure 12B:
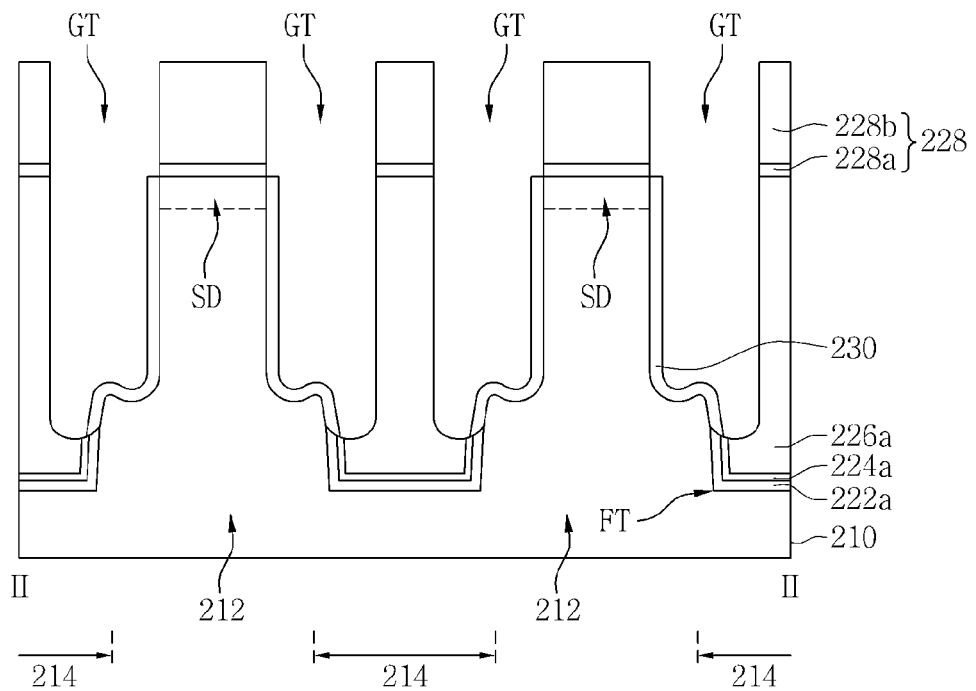

Referring to FIGS. 5, 12A, and 12B, the method of fabricating the semiconductor device according to the embodiment of the inventive concept may include forming a gate insulating layer 230 in the gate trenches GT at operation S114. The gate insulating layer 230 may be formed on bottom and side surfaces of the gate trenches GT. For example, the gate insulating layer 230 may be formed on bottom and side surfaces of the gate trenches GT disposed in the active region 212. For example, a gate barrier layer 232a may be in contact with the gate insulating layer 230 and in contact with the gate trenches GT in the field region 214. The gate insulating layer 230 may include an oxide layer. The formation of the gate insulating layer 230 may include a thermal oxidation process.

Figure 13A:
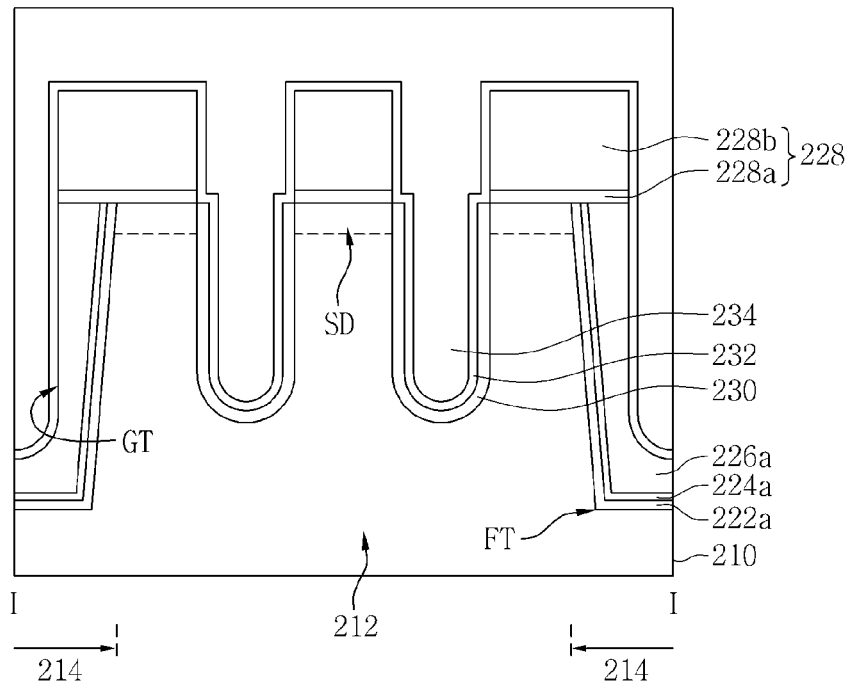
Figure 13B:
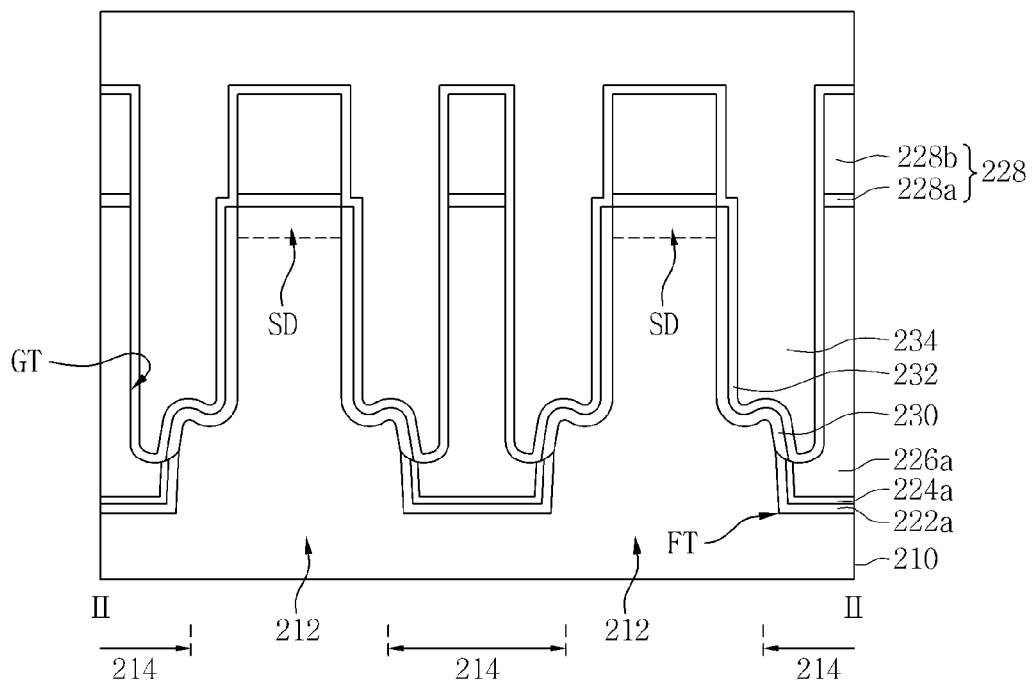

Referring to FIGS. 13A and 13B, the method of fabricating the semiconductor device according to the embodiment of the inventive concept may include forming a gate barrier material layer 232 and a gate electrode material layer 234 on the gate insulating layer 230. The gate barrier material layer 232 and the gate electrode material layer 234 may be formed on bottom and side surfaces of the gate insulating layer 230 in the active region 212, and formed on bottom and side surfaces of the gate trenches GT in the field region 214. The gate barrier material layer 232 may include titanium nitride (TiN), and the gate electrode material layer 234 may include tungsten (W). The formation of the gate barrier material layer 232 and the gate electrode material layer 234 may include an atomic layer deposition (ALD) process or a CVD process.

Figure 14A:
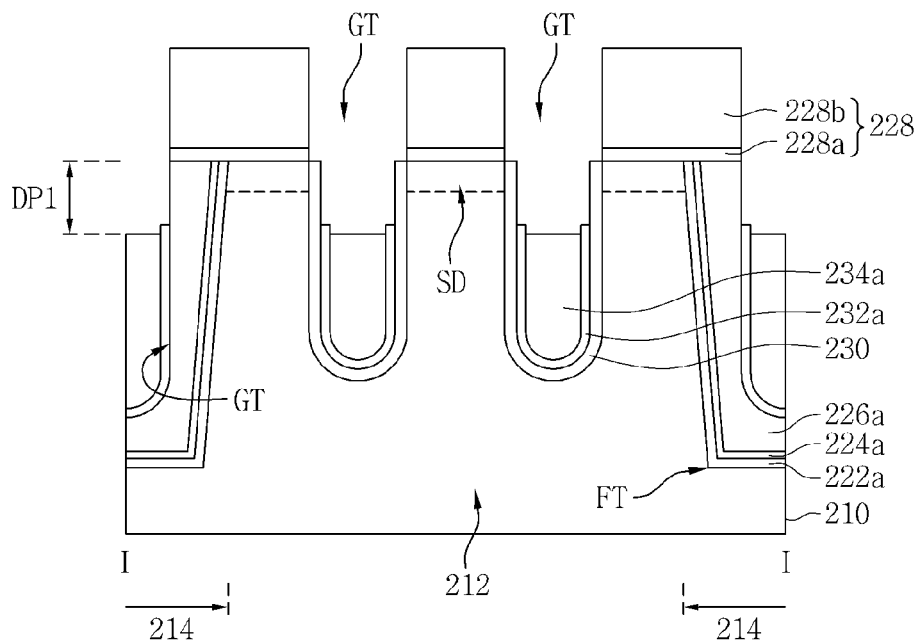
Figure 14B:
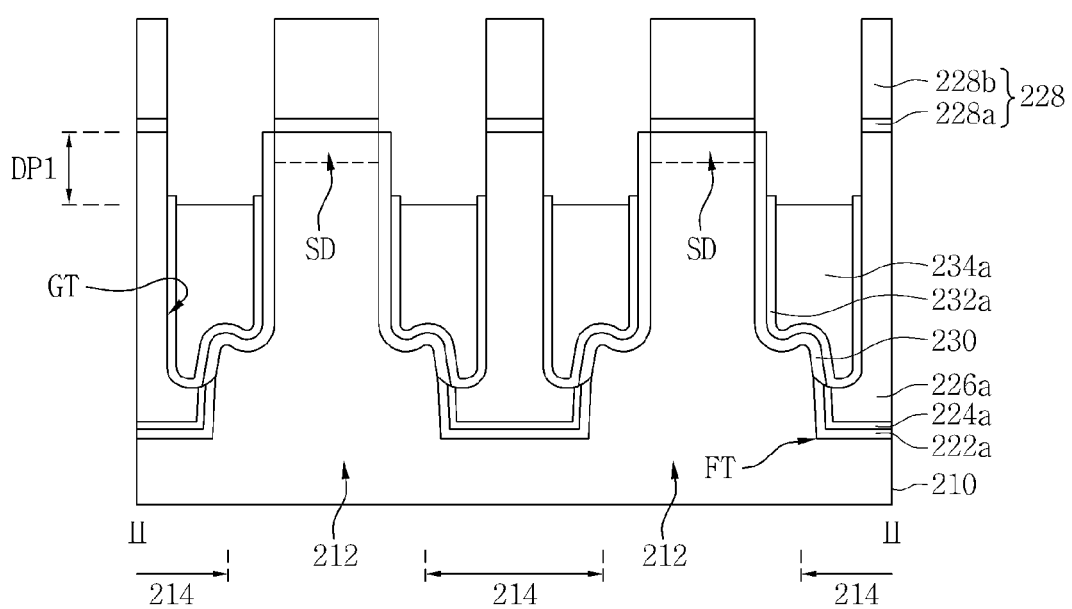

Referring to FIGS. 5, 14A, and 14B, the method of fabricating the semiconductor device according to the embodiment of the inventive concept may include forming a first preliminary gate barrier layer 232a and a first preliminary gate electrode 234a recessed to a first depth DP1 using a dry etching process in each of the gate trenches GT at operation S116. A top surface of the first preliminary gate electrode 234a may be recessed to a depth of, for example, about 750 Å from the top surface of the substrate 210. In this case, a top surface of the first preliminary gate electrode 234a may be recessed to have a depth lower than a top surface of the first preliminary gate barrier layer 232a.

Figure 15A:
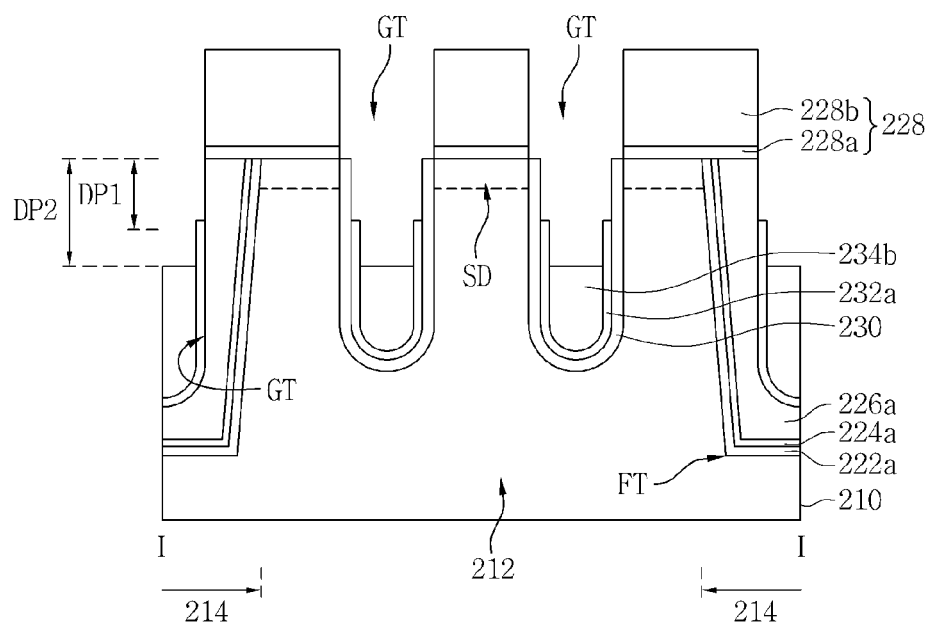
Figure 15B:
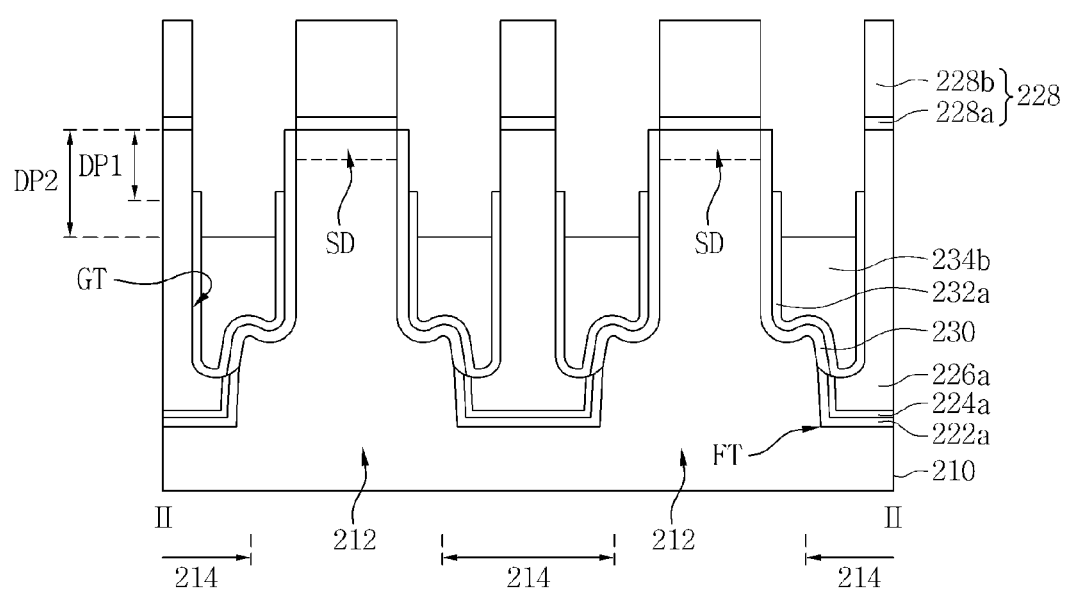

Referring to FIGS. 5, 15A, and 15B, the method of fabricating the semiconductor device according to the embodiment of the inventive concept may include forming a second preliminary gate electrode 234b by recessing the first preliminary gate electrode 234a to have a second depth DP2 greater than the first depth DP1 using a first wet etching process at operation S118. The first wet etching process may be performed using an electrode metal etchant (hereinafter, referred to as a first etchant) for selectively etching only tungsten (W) to obtain the second preliminary gate electrode 234b formed of tungsten. The first wet etching process may be performed at room temperature. The first etchant may contain water ($H_2O$), hydrogen peroxide ($H_2O_2$), and an ammonium ($NH_4$)-based tungsten etching inhibitor. For example, water, hydrogen peroxide, and the ammonium-based tungsten etching inhibitor contained in the first etchant may be prepared in a weight ratio shown in Table 1.

TABLE 1

| Composition | Hydrogen peroxide ($H_2O_2$) | Water ($H_2O$) | Ammonium ($NH_4$)-based tungsten etching inhibitor |
|---|---|---|---|
| Weight ratio | 30 (wt %) | 69.995 to 69.999 (wt %) | 0.001 to 0.005 (wt %) |

As illustrated in Table 1, by controlling a weight ratio of the ammonium-based tungsten etching inhibitor to water such that the ammonium-based tungsten etching inhibitor, water, and hydrogen peroxide are contained at a content of 100% by weight, the first etchant may be prepared. Since the first etchant has a higher etch selectivity against tungsten (W) and titanium nitride (TiN) than 10:1, the first etchant may selectively etch only tungsten. In this case, the $NH_3$-based tungsten etch inhibitor may control the etch rate of tungsten and prevent the tungsten from being excessively etched so that a surface dispersion of the tungsten can be minimized. Due to the first wet etching process, the second preliminary gate electrode 234b having a top surface recessed from the top surface of the substrate 210 to have the second depth DP2 greater than the first depth DP1 may be formed. For example, the second preliminary gate electrode 234b may be recessed to have a depth of about 800 Å from the top surface of the substrate 210.

Figure 16A:
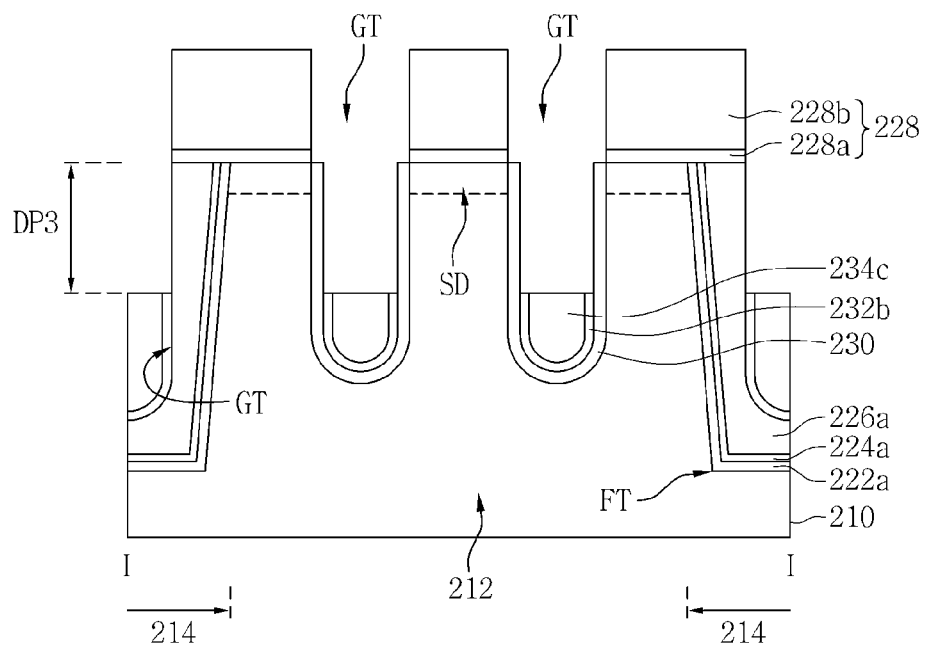
Figure 16B:
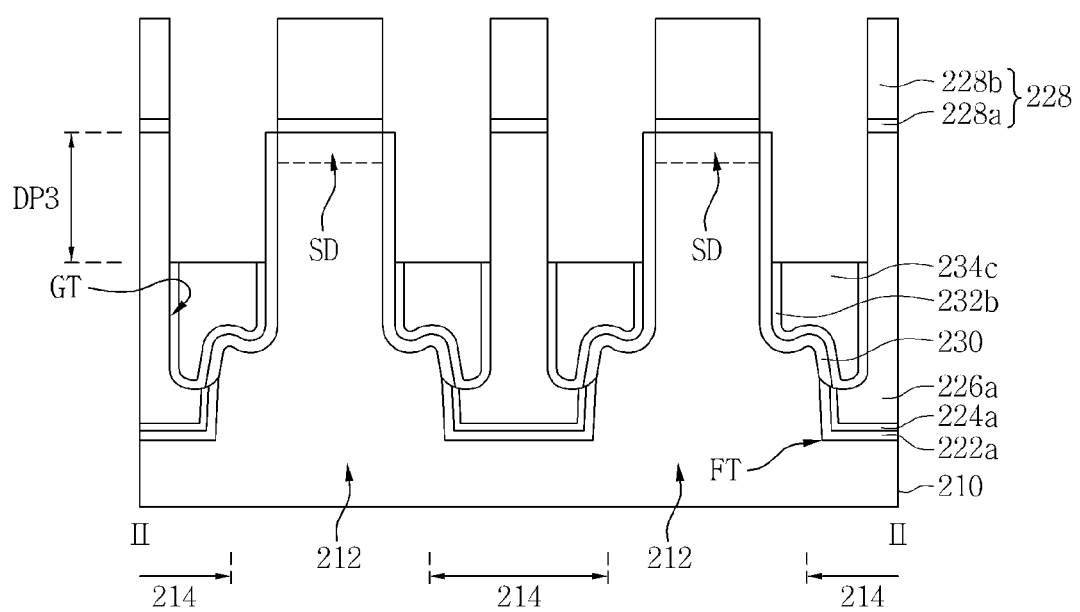

Referring to FIGS. 5, 16A and 16B, the method of fabricating the semiconductor device according to the embodiment of the inventive concept may include forming a gate barrier layer 232b and a gate electrode 234c recessed to have a third depth greater than the second depth using a second wet etching process at operation S120. The second wet etching process may be performed at a room temperature using a barrier metal etchant (hereinafter, referred to as a second etchant) for batch-etching tungsten (W) and titanium nitride (TiN). The second etchant may be prepared in a weight ratio illustrated in Table 2 by adding sulfuric acid ($H_2SO_4$) to the first etchant (a mixture of water, hydrogen peroxide, and ammonium-based tungsten etching inhibitor).

TABLE 2

| Composition | First etchant | Sulfuric acid ($H_2SO_4$) |
| --- | --- | --- |
| Weight ratio | 7.5 to 15 (wt %) | 85 to 92.5 (wt %) |

As illustrated in Table 2, by controlling a weight ratio of the first etchant to sulfuric acid such that the first etchant and sulfuric acid are contained at a content of 100% by weight, the second etchant may be prepared. In this case, hydrogen peroxide and sulfuric acid may be mixed in a volume ratio of 4:1 to 14:1. Since the second etchant has an etch selectivity ratio of 5:1 against tungsten and titanium nitride, tungsten and titanium nitride may be etched at the same time. In this case, a material (TiN) forming the gate barrier layer 232b, which may partially remain on a side surface of the gate insulating layer 230 and a side surface of the gate trench GT that are not in contact with the gate barrier layer 232b, may be completely removed during the etching process using the second etchant. Due to the above-described second wet etching process, the top surface of the gate electrode 234c may be recessed to the third depth greater than the second depth DP2, and the top surfaces of the gate electrode 234c and the gate barrier layer 232b may be at a level with or lower than ½ the depth of the gate trench GT. For example, the top surface of the gate electrode 234c may be recessed to a depth of about 830 Å from the substrate 210.

Figure 17A:
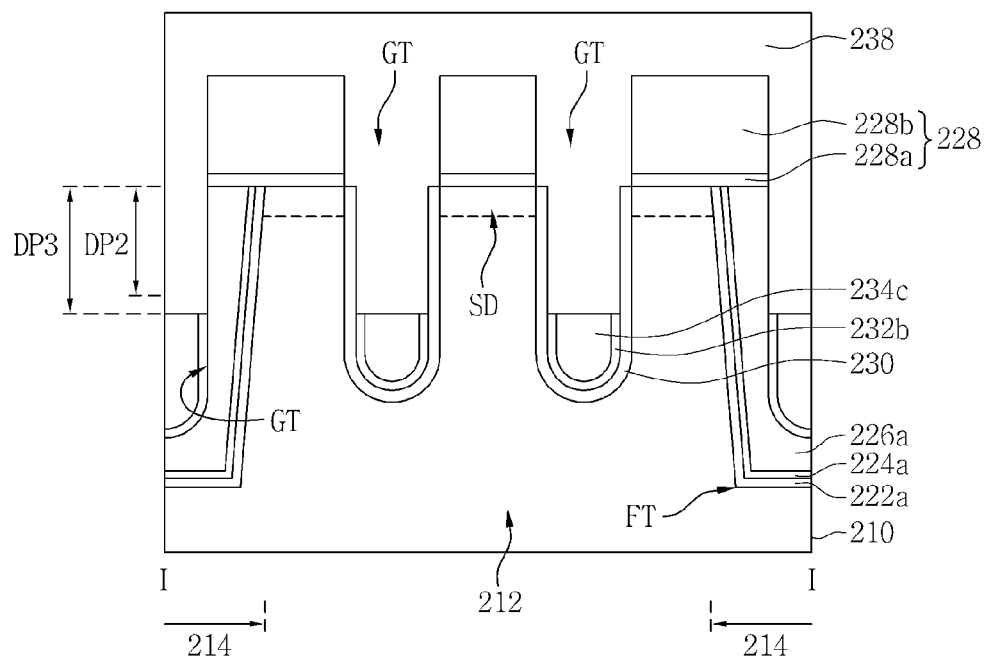
Figure 17B:
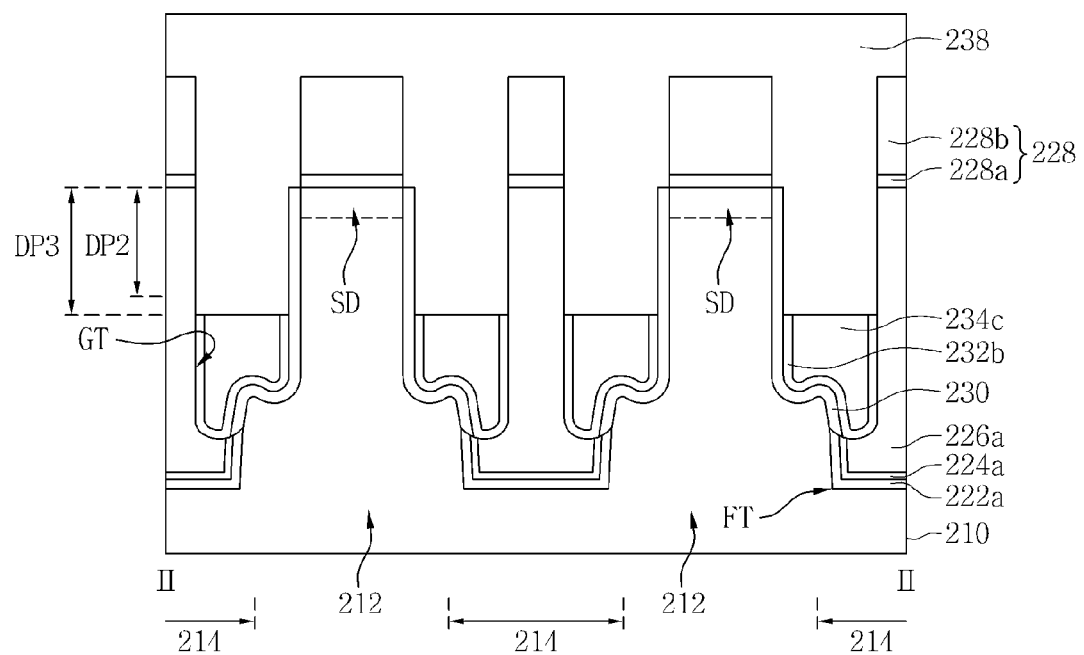

Referring to FIGS. 17A and 17B, the method of fabricating the semiconductor device according to the embodiment of the inventive concept may include forming a gate capping material layer 238 to cover the gate insulating layer 230, the gate barrier layer 232b, the gate electrode 234c, and the gate trench mask 228. The formation of the gate capping material layer 238 may include a CVD process. The gate capping material layer 238 may include silicon nitride.

Figure 18A:
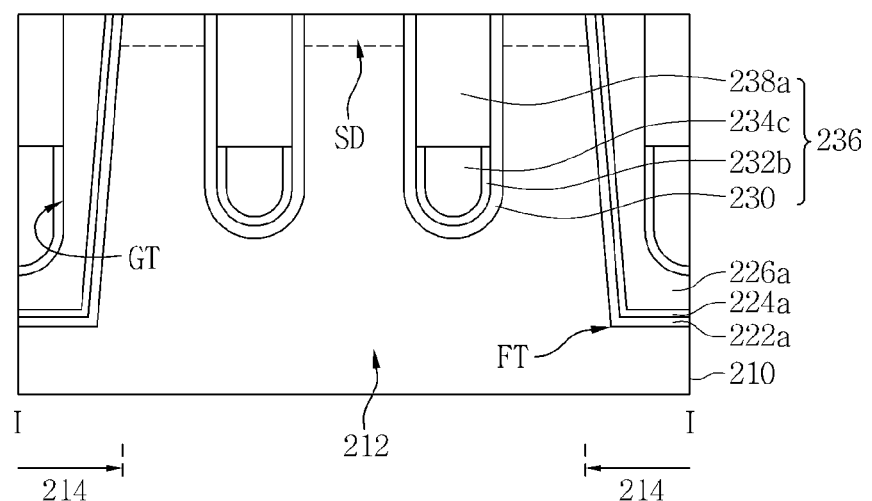
Figure 18B:
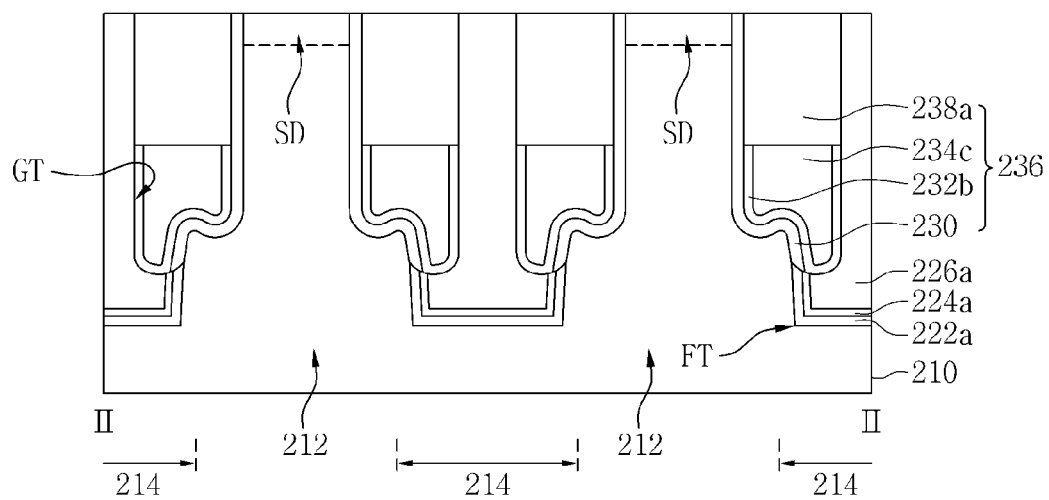

Referring to FIGS. 5, 18A and 18B, the method of fabricating the semiconductor device according to the embodiment of the inventive concept may include forming a gate capping layer 238a in each of the gate trenches GT at operation S122. The formation of the gate capping layer 238a may include a planarization process. The planarization process may include a CMP process and an etch-back process. Due to the planarization process, the gate capping layer 238a may fill only the gate trenches GT. Thereafter, a process of forming bit lines to cross the gate lines 236 at right angles, and a process of forming storages in contact with the active regions 212 may be performed.

Figure 19A:
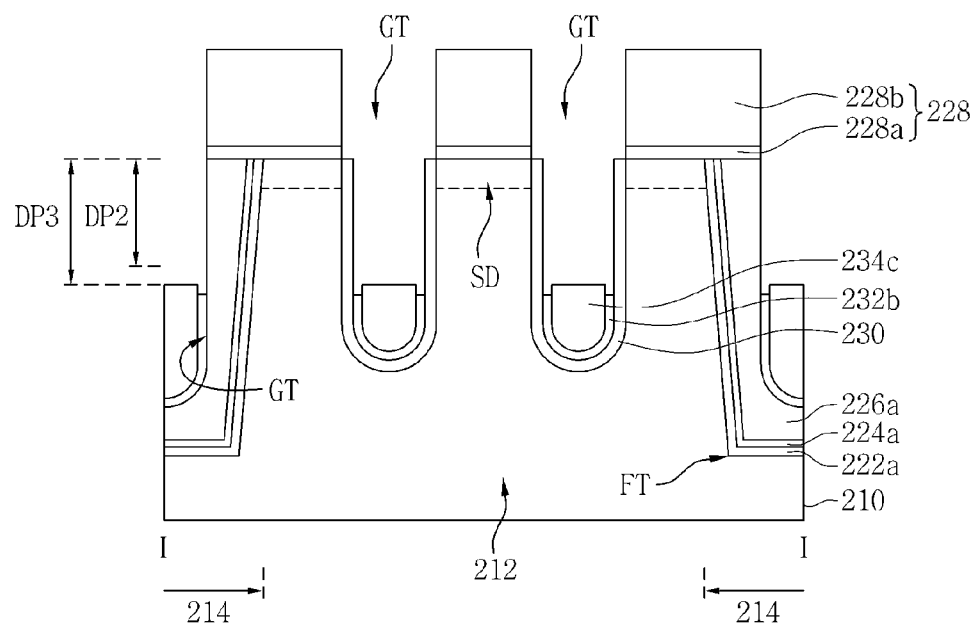
FIGS. 19A and 19B are schematic longitudinal sectional views taken along lines I-I and II-II of FIG. 1, illustrating a method of fabricating the semiconductor device according to an embodiment of the inventive concept.
Figure 19B:
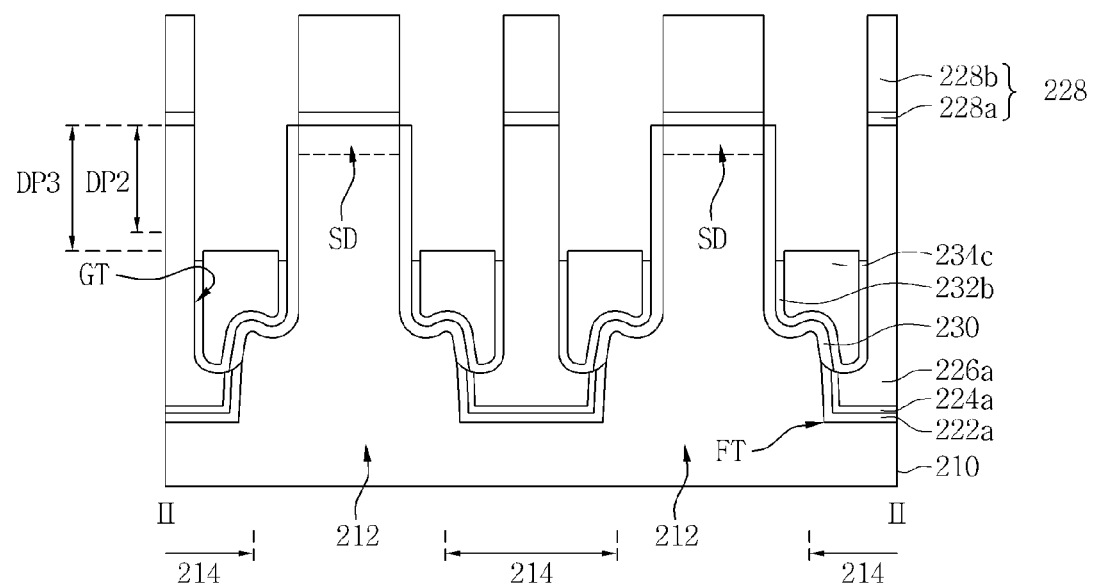

FIGS. 19A and 19B are diagrams illustrating a method of fabricating the semiconductor device described with reference to FIGS. 3A and 3B, and FIGS. 20A and 20B are diagrams illustrating a method of fabricating the semiconductor device described with reference to FIGS. 4A and 4B. A gate barrier layer and a gate electrode formed using the second wet etching process described with reference to FIGS. 16A and 16B, according to other embodiments of the inventive concept, will be described.

FIGS. 19A and 19B are schematic longitudinal sectional views taken along lines I-I and II-II of FIG. 1, respectively, illustrating a method of fabricating a semiconductor device according to an embodiment of the inventive concept. Referring to FIGS. 19A and 19B, the method of fabricating the semiconductor device according the embodiment of the inventive concept may include recessing a top surface of the gate electrode 234c using a second wet etching process to a third depth DP3 greater than the second depth DP2 described above with reference to FIGS. 15A and 15B. In this case, the top surface of the gate barrier layer 232b may be recessed to have a greater depth than the top surface of the gate electrode 234c. Although the second etchant used for the second wet etching process is an etchant to etch the gate barrier layer 232b and the gate electrode 234c at the same time, when a content ratio of hydrogen peroxide to sulfuric acid is controlled within the above-described range and an etching time is controlled, the gate barrier layer 232b may be etched at a higher rate than the gate electrode 234c so that the top surface of the gate barrier layer 232b can be recessed to have a depth lower than the depth of the top surface of the gate electrode 234c.

Figure 20A:
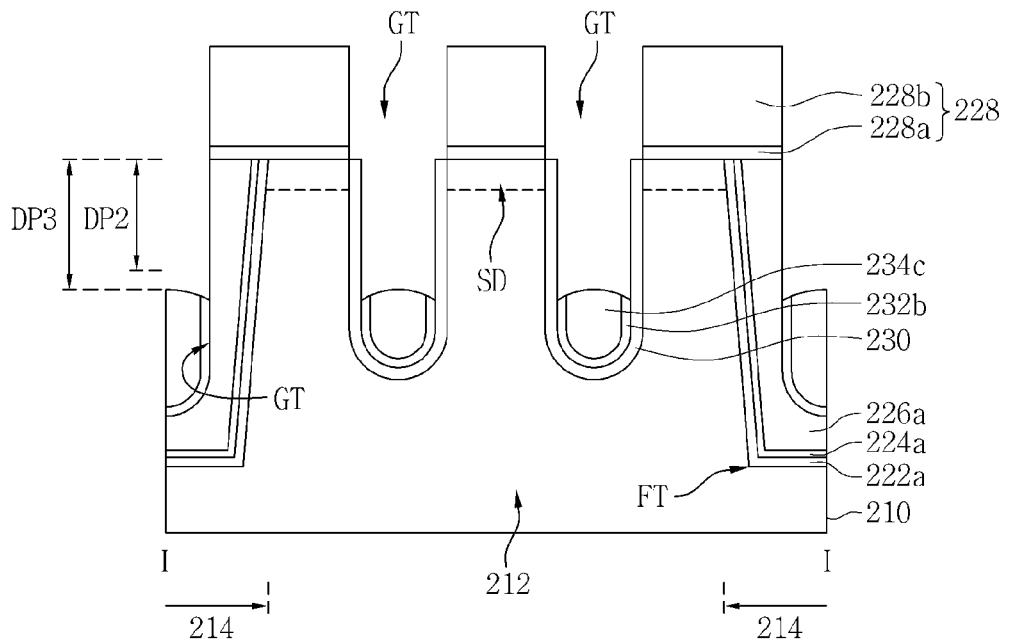
FIGS. 20A and 20B are schematic longitudinal sectional views taken along lines I-I and II-II of FIG. 1, respectively, illustrating a method of fabricating the semiconductor device according to an embodiment of the inventive concept.
Figure 20B:
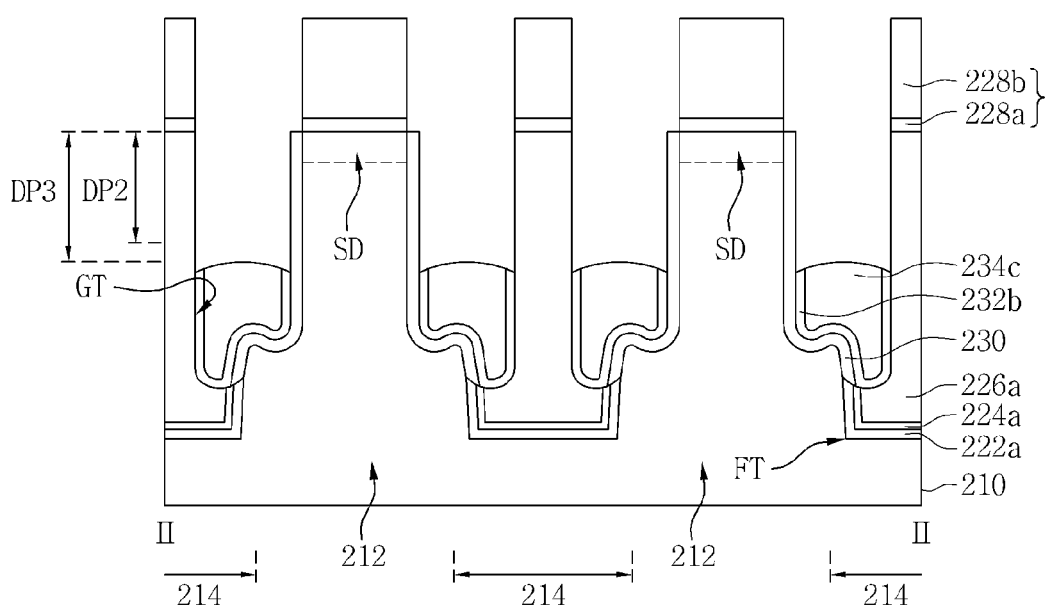

FIGS. 20A and 20B are schematic longitudinal sectional views taken along lines I-I and II-II of FIG. 1, respectively, illustrating a method of fabricating a semiconductor device according to an embodiment of the inventive concept. Referring to FIGS. 20A and 20B, the method of fabricating the semiconductor device according to the embodiment of the inventive concept may include recessing the top surface of the gate electrode 234c using the second wet etching process to the third depth DP3 greater than the second depth DP2 described above with reference to FIGS. 15A and 15B. In this case, the top surfaces of the gate electrode 234c and the gate barrier layer 232b may be recessed to have a depth lower than a half of the depth of the gate trenches GT. Simultaneously, the gate barrier layer 232b may be recessed such that a top end of a portion of the gate barrier layer 232b in contact with the gate insulating layer 230 becomes lower than a top end of a portion of the gate barrier layer 232b in contact with the gate electrode 234c or the gate trench GT. Alternatively, the top surfaces of the gate electrode 234c and the gate barrier layer 232b may form a curve. For example, the top surface of the gate electrode 234c and the top surface of the gate barrier layer 232b may be recessed and form a curve from a center of the gate electrode 234c to one side of the gate barrier layer 232b, which is in contact with a side surface of the gate insulating layer 230 or the gate trench GT. When the content ratio of hydrogen peroxide HO to sulfuric acid HSO contained in the second etchant is controlled, the gate barrier layer 232a may be etched at a higher rate than the gate electrode 234a so that the top surface of the gate barrier layer 232a can be recessed to have a depth lower than the top surface of the gate electrode 234a. During this process, since protrusions of the gate barrier layer 232a and the gate electrode 234a may be attacked and etched more rapidly, the top surfaces of the gate electrode 234a and the gate barrier layer 232a may form a curve with respect to a plane of the top surface of the substrate 210.

Figure 21:
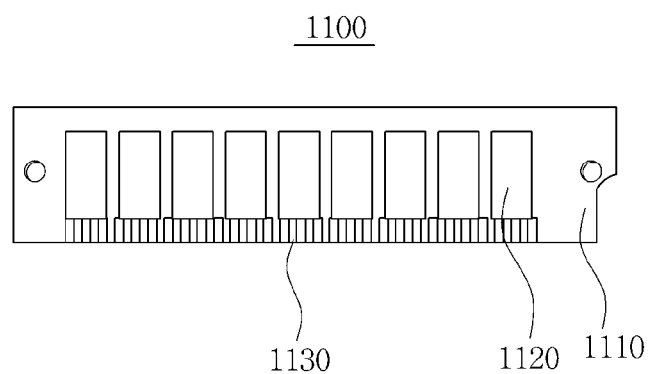
FIG. 21 is a schematic diagram illustrating a module including a semiconductor device according to an embodiment of the inventive concept.

FIG. 21 is a conceptual diagram illustrating a main memory unit 1100 including at least one of the semiconductor devices 200 (200a, 200b, and 200c) according to an embodiment of the inventive concept. Referring to FIG. 21, the main memory unit 1100 according to the embodiment of the inventive concept may include a main memory unit substrate 1110 and a plurality of memory devices 1120 and a plurality of terminals 1130 disposed on the main memory unit substrate 1110. The memory devices 1120 may be a semiconductor package including one of the semiconductor devices 200a, 200b, and 200c according to the various embodiments of the inventive concept. The terminals 1130 may be electrically connected to the memory devices 1120, respectively.

Figure 22:
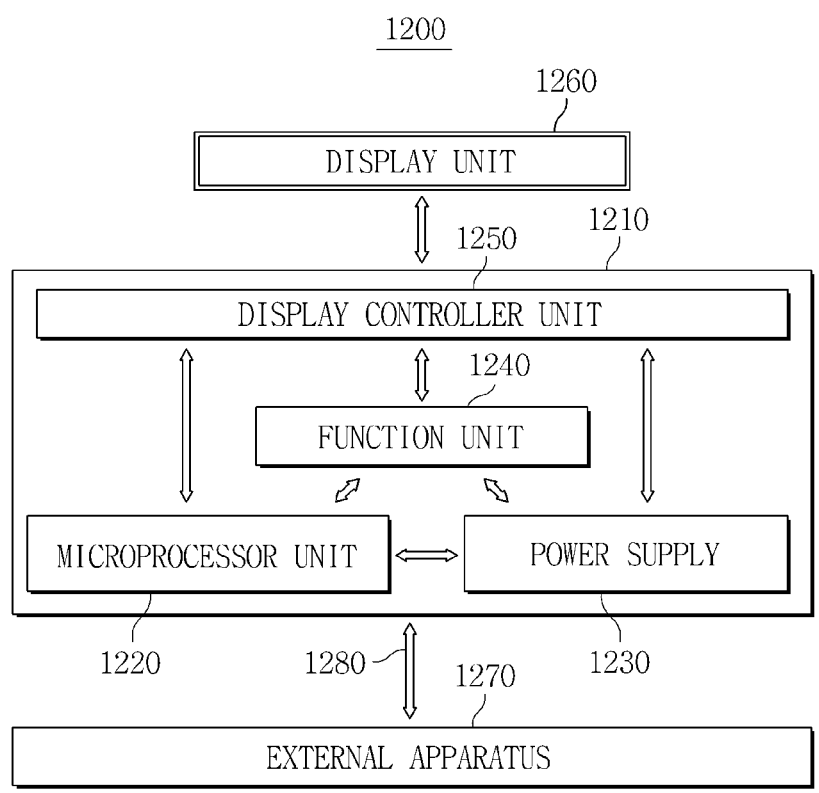
FIG. 22 is a schematic block diagram illustrating an electronic system including a semiconductor device according to an embodiment of the inventive concept.

FIG. 22 is a conceptual block diagram illustrating an electronic system 1200 including a semiconductor device 200 (200a, 200b, 200c) according to an embodiment of the inventive concept. Referring to FIG. 22, the semiconductor device 200 according to the embodiment of the inventive concept may be applied to the electronic system 1200. The electronic system 1200 may include a body 1210, a microprocessor (MP) unit 1220, a power supply 1230, a function unit 1240, and/or a display controller 1250. The body 1210 may be a system board or mother board including a printed circuit board (PCB). The MP unit 1220, the power supply 1230, the function unit 1240, and the display controller unit 1250 may be mounted on the body 1210. The display unit 1260 may be disposed on a top surface of the body 1210 or an outside of the body 1210. For example, the display unit 1260 may be disposed on the surface of the body 1210 and display an image processed by the display controller unit 1250. The power supply 1230 may function to receive a predetermined voltage from an external battery (not illustrated), divide the voltage into various voltage levels, and supply the divided voltages to the MP unit 1220, the function unit 1240, and the display controller unit 1250. The MP unit 1220 may receive a voltage from the power supply 1230 and control the function unit 1240 and the display unit 1260. The function unit 1240 may serve various functions of the electronic system 1200. For example, when the electronic system 1200 is a mobile electronic device, such as a portable phone, the function unit 1240 may include several components capable of serving wireless communication functions, for example, outputting an image to the display unit 1260 or outputting a voice to a speaker, by dialing or communicating with an external apparatus 1270. When a camera is also mounted, the function unit 1240 may serve as a camera image processor. In applied embodiments, when the electronic system 1200 is connected to a memory card to increase capacity, the function unit 1240 may be a memory card controller. The function unit 1240 may transmit/receive signals to/from the external apparatus 1270 through a wired or wireless communication unit 1280. Furthermore, when the electronic system 1200 requires a universal serial bus (USB) to increase functionality, the function unit 1240 may serve as an interface controller.

The semiconductor devices 200 (200a, 200b, and 200c) according to various embodiments of the inventive concept may be included in at least one of the MP unit 1220 and the function unit 1240.

Figure 23:
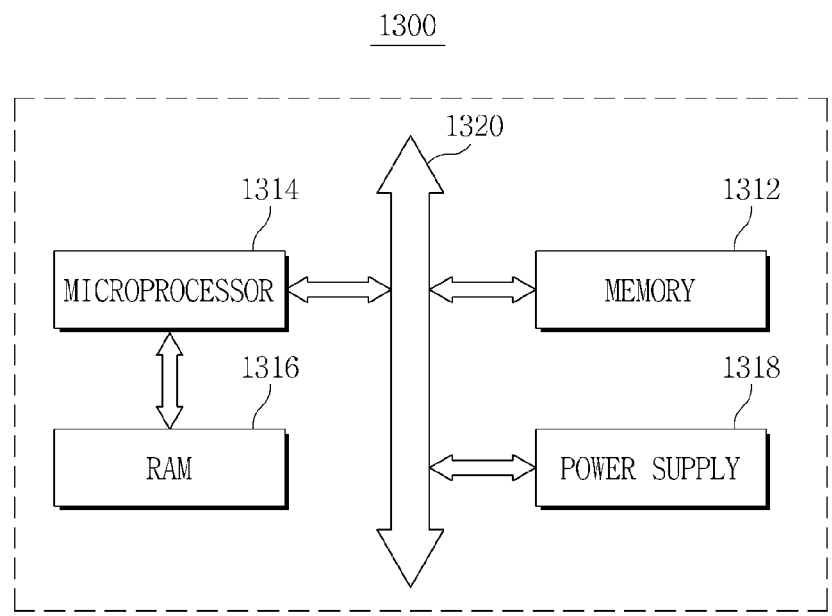
FIG. 23 is a schematic block diagram illustrating an electronic system including a semiconductor device according to an embodiment of the inventive concept.

FIG. 23 is a schematic block diagram illustrating an electronic system 1300 including a semiconductor device according to an embodiment of the inventive concept. Referring to FIG. 23, the electronic system 1300 may include a semiconductor device 200 according to an embodiment of the inventive concept. The electronic system 1300 may be applied to a mobile electronic device or a computer. For example, the electronic system 1300 may include a memory system 1312, a microprocessor (MP) 1314, a random access memory (RAM) 1316, and a user interface 1318 configured to communicate data using a bus 1320. The MP 1314 may program and control the electronic system 1300. The RAM 1316 may be used as an operation memory of the MP 1314. For example, the MP 1314 or the RAM 1316 may include the semiconductor devices 200a, 200b, and 200c according to the embodiments of the inventive concept. The MP 1314, the RAM 1316, and/or other elements may be assembled within a single package. The user interface 1318 may be used to input data to the electronic system 1300 or output data from the electronic system 1300. The memory system 1312 may store codes for operating the MP 1314, data processed by the MP 1314, or external input data. The memory system 1312 may include a controller and a memory.

Figure 24:
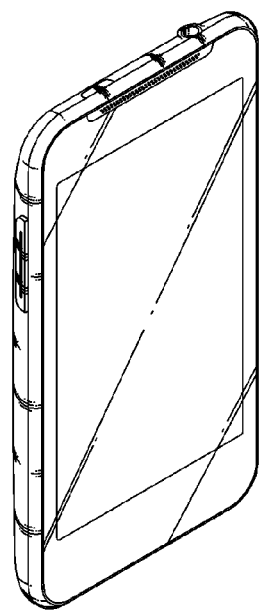
FIG. 24 is a schematic diagram illustrating a mobile electronic device including a semiconductor device according to an embodiment of the inventive concept.

FIG. 24 is a schematic diagram illustrating a mobile electronic device including a semiconductor device according to an embodiment of the inventive concept. The mobile electronic device 1400 may be interpreted as a tablet PC. In addition, at least one of the semiconductor devices 200 according to the embodiments of the inventive concept may be used not only for a tablet PC but also for a portable computer such as a laptop computer, an MPEG-1 audio layer 3 (MP3) player, an MP4 player, a navigation device, a solid-state disk (SSD), a desktop computer, or electronic devices for automotive and household uses.

The main memory unit 1100, the electronic systems 1200 and 1300, and the mobile electronic device may be referred to as an electronic apparatus to read and write data in a semiconductor device to perform a function thereof. The electronic apparatus may further include a functional unit to perform the function according to data stored in or read from the semiconductor device. The functional unit may be a unit included in the electronic apparatus other than the semiconductor device. The unit may be one or more terminals to be connected to the semiconductor device, a main memory unit substrate on which the semiconductor device is mounted, a display unit, another functional unit, etc.

According to an embodiment of the inventive concept, a method of fabricating a semiconductor device can prevent a material forming a gate barrier layer from remaining on a side surface of a gate insulating layer and a side surface of a gate trench, which are not in contact with the gate barrier layer.

In a method of fabricating a semiconductor device according to an embodiment of the inventive concept, since a short dry etching process time is taken to form a gate barrier layer and a gate electrode to be recessed from a top surface of a substrate, a loss of a portion of a gate insulating layer can be prevented, and the occurrence of defects in a side surface of a gate trench disposed in a field region can be prevented.

In a method of fabricating a semiconductor device according to an embodiment of the inventive concept, a surface dispersion of a gate electrode can be minimized.

In a method of fabricating a semiconductor device according to an embodiment of the inventive concept, a distance between a gate barrier layer and an impurity layer of an active region can be increased, and a channel length can be reduced, thereby reducing a leakage current.

As a result, malfunctions in semiconductor devices can be minimized, and deterioration of operating characteristics of the semiconductor devices can be prevented.

Furthermore, a method of fabricating a semiconductor device according to an embodiment of the inventive concept can reduce a failure rate during fabrication of highly integrated transistors, thereby increasing a yield thereof.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A method of fabricating a semiconductor device, the method comprising:
   forming a gate trench in a substrate;
   forming a gate insulating layer on bottom and side surfaces of the gate trench;
   forming a gate barrier material layer and a gate electrode material layer on bottom and side surfaces of the gate insulating layer and a top surface of the substrate;
   removing the gate barrier material layer and the gate electrode material layer from the substrate to form a first preliminary gate barrier layer and a first preliminary gate electrode recessed to have a first depth from the top surface of the substrate within the gate trench;
   removing an upper portion of the first preliminary gate electrode by means of a first wet etching process using a first etchant to form a second preliminary gate electrode recessed to have a second depth greater than the first depth;
   removing an upper portion of the first preliminary gate barrier layer and an upper portion of the second preliminary gate electrode by means of a second wet etching process using a second etchant to form a gate electrode and a gate barrier layer recessed to a third depth greater than the second depth; and
   forming a gate capping layer to cover the gate barrier layer and the gate electrode and fill the gate trench.

2. The method of claim 1, wherein the gate barrier material layer includes titanium nitride and the gate electrode material layer includes tungsten.

3. The method of claim 2, wherein the first etchant contains about 69.995 to 69.999% by weight water, about 30% by weight hydrogen peroxide, and about 0.001 to 0.005% by weight ammonium-based tungsten etching inhibitor.

4. The method of claim 3, wherein the first etchant has a higher etch selectivity against the first preliminary gate electrode and the first preliminary gate barrier layer than 10:1.

5. The method of claim 2, wherein the second etchant contains sulfuric acid and the first etchant.

6. The method of claim 5, wherein the second etchant contains about 7.5 to 15% by weight sulfuric acid and about 85 to 92.5% by weight first etchant.

7. The method of claim 6, wherein the second etchant has a higher etch selectivity against the first preliminary gate barrier layer and the second preliminary gate electrode than 5:1.

8. The method of claim 6, wherein a volume ratio of hydrogen peroxide to sulfuric acid ranges from 4:1 to 14:1.

9. The method of claim 1, wherein the removing of the gate barrier material layer and the gate electrode material layer from the substrate includes performing an etch-back process using a dry etching process.

10. The method of claim 1, wherein a top end of a portion of the gate barrier layer that is in contact with the gate insulating layer is lower than a top end of a portion of the gate barrier layer that is in contact with the gate electrode.

11. The method of claim 10, wherein a top surface of the gate electrode and a top surface of the gate barrier layer form a gentle downward curve from the center of the gate electrode to one side of the gate barrier layer that is in contact with the gate insulating layer.

12. A method of fabricating a semiconductor device, the method comprising:
   forming an active region and a field region in a substrate;
   forming a gate trench in the substrate to cross the active region and the field region, and forming a gate insulating layer on an exposed surface of the active region within the gate trench;
   forming a gate barrier material layer and a gate electrode material layer on the surface of the gate insulating layer, the surface of the field region exposed within the gate trench, and on the substrate;
   removing the gate barrier material layer and the gate electrode material layer from the substrate to form a gate barrier layer and a gate electrode having top surfaces lower than the surface of the substrate, wherein the top surface of the gate electrode is lower than the top surface of the gate barrier layer;
   recessing the top surface of the gate electrode using a first wet etching process to be lower than the top surface of the gate barrier layer;
   recessing the top surface of the gate barrier layer using a second wet etching process to be lower than the top surface of the gate electrode; and
   forming a gate capping layer to cover the gate barrier layer and the gate electrode and fill the gate trench.

13. The method of claim 12, wherein the gate trench has a lower bottom surface in the field region than in the active region.

14. The method of claim 12, wherein the forming of the field region comprises:
   forming a field trench in the substrate;
   conformally forming a trench liner on bottom and side surfaces of the field trench; and
   forming a field trench insulating layer on the field trench liner to fill the field trench.

15. The method of claim 14, wherein the gate barrier material layer is in direct contact with the field trench insulating layer.

* * * * *